United States Patent
Hayashi

(10) Patent No.: US 9,793,194 B2
(45) Date of Patent: Oct. 17, 2017

(54) LEADFRAME

(71) Applicant: SHINKO ELECTRIC INDUSTRIES CO., LTD., Nagano (JP)

(72) Inventor: Shintaro Hayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/275,560

(22) Filed: Sep. 26, 2016

(65) Prior Publication Data

US 2017/0117210 A1 Apr. 27, 2017

(30) Foreign Application Priority Data

Oct. 23, 2015 (JP) .................... 2015-209349

(51) Int. Cl.
*H01L 23/495* (2006.01)
*H01L 23/31* (2006.01)
*H01L 21/48* (2006.01)
*H01L 23/29* (2006.01)
(Continued)

(52) U.S. Cl.
CPC .... *H01L 23/49548* (2013.01); *H01L 21/4828* (2013.01); *H01L 23/3157* (2013.01); *H01L 23/49506* (2013.01); *H01L 23/49565* (2013.01); *H01L 24/97* (2013.01); *H01L 21/568* (2013.01); *H01L 23/295* (2013.01); *H01L 23/3121* (2013.01); *H01L 24/29* (2013.01); *H01L 24/32* (2013.01); *H01L 24/45* (2013.01); *H01L 24/48* (2013.01); *H01L 24/73* (2013.01); *H01L 24/81* (2013.01); *H01L 24/83* (2013.01); *H01L 24/85* (2013.01); *H01L 24/92* (2013.01); *H01L 2224/131* (2013.01); *H01L 2224/13144* (2013.01); *H01L 2224/13147* (2013.01); *H01L 2224/16245* (2013.01); *H01L 2224/2919* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2224/73265* (2013.01); *H01L 2224/81385* (2013.01); *H01L 2224/83385* (2013.01); *H01L 2224/85439* (2013.01); *H01L 2224/85444* (2013.01); *H01L 2224/85455* (2013.01); *H01L 2224/85464* (2013.01); *H01L 2224/92247* (2013.01); *H01L 2224/97* (2013.01); *H01L 2924/00011* (2013.01); *H01L 2924/18161* (2013.01)

(58) Field of Classification Search
CPC .......... H01L 23/49548; H01L 21/4828; H01L 23/495; H01L 23/49544; H01L 23/49565
USPC ........................................................ 257/676
See application file for complete search history.

(56) References Cited

U.S. PATENT DOCUMENTS 7,170,150 B2 *  1/2007  Lee .................... H01L 23/3107
                                                        257/666
8,373,258 B2 *  2/2013  Mizusaki ............ H01L 21/561
                                                        257/666
(Continued)

FOREIGN PATENT DOCUMENTS

JP        2014-044980         3/2014

*Primary Examiner* — Luan C Thai
(74) *Attorney, Agent, or Firm* — IPUSA, PLLC

(57) ABSTRACT

A leadframe includes an individual region to become a semiconductor device, and an outer frame part supporting the individual region through its peripheral edge. The thickness of the outer frame part is greater than the thickness of the individual region.

20 Claims, 22 Drawing Sheets

(51) Int. Cl.
*H01L 21/56* (2006.01)
*H01L 23/00* (2006.01)

(56) References Cited

U.S. PATENT DOCUMENTS

| | | | |
|---|---|---|---|
| 8,420,446 B2* | 4/2013 | Yo | C25D 5/12 257/E21.505 |
| 8,739,401 B2* | 6/2014 | Shimazaki | H01L 21/561 29/846 |
| 2014/0346656 A1* | 11/2014 | Eugene Lee | H01L 23/49503 257/676 |

* cited by examiner

LEADFRAME

CROSS-REFERENCE TO RELATED APPLICATION

This application is based upon and claims the benefit of priority of the prior Japanese Patent Application No. 2015-209349, filed on Oct. 23, 2015, the entire contents of which are incorporated herein by reference.

FIELD

A certain aspect of the embodiments discussed herein is related to leadframes.

BACKGROUND

A no-leads semiconductor device referred to as a quad flat non-leaded (QFN) package is known. QFN-type semiconductor devices are formed by, for example, mounting semiconductor chips on a leadframe, encapsulating the semiconductor chips in resin, and cutting out individual devices.

Leadframes used for QFN-type semiconductor devices include a product region, that is, a region to ultimately become products (semiconductor devices), and a non-product region, that is, a region to be ultimately removed and not to become products (semiconductor devices).

Reference may be made to Japanese Laid-open Patent Publication No. 2014-44980 for related art.

SUMMARY

According to an aspect of the present invention, a leadframe includes an individual region to become a semiconductor device, and an outer frame part supporting the individual region through its peripheral edge. The thickness of the outer frame part is greater than the thickness of the individual region.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
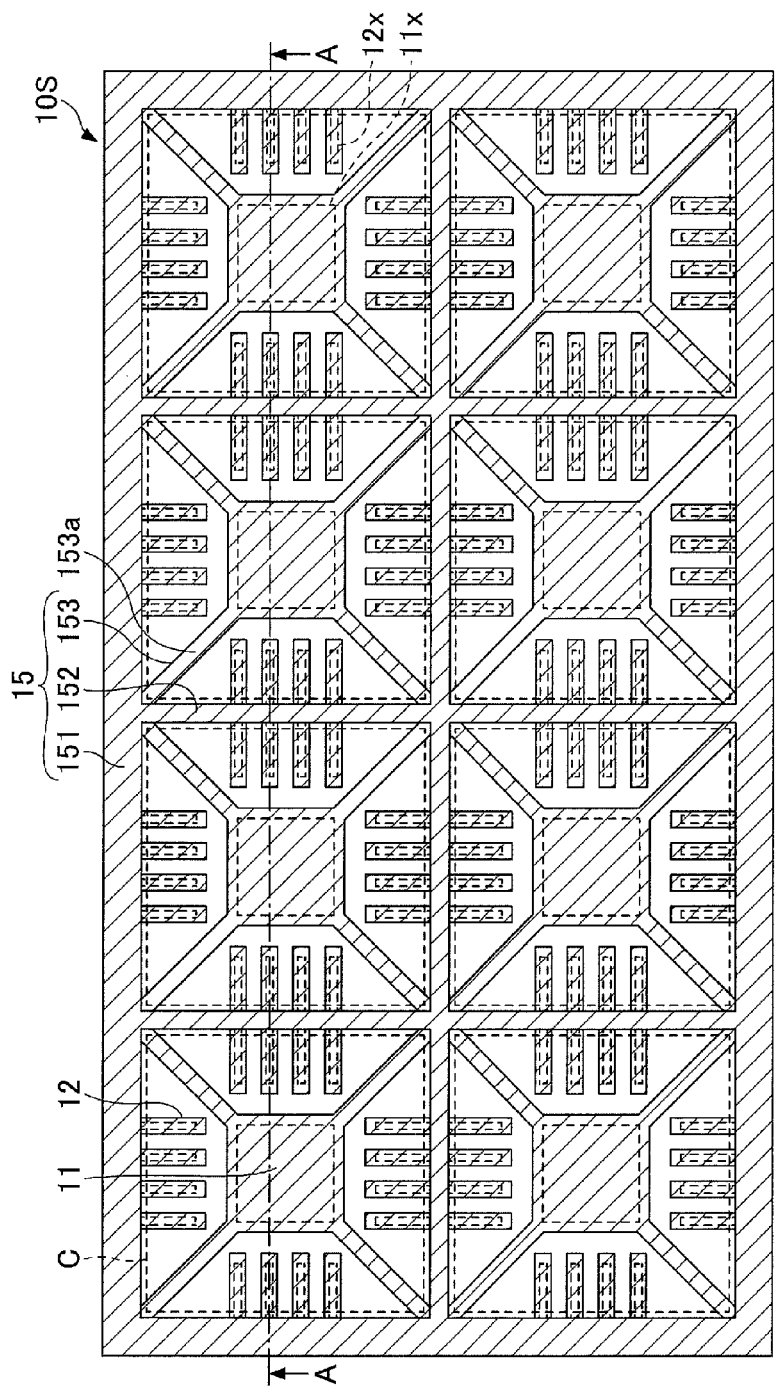
FIGS. 1A and 1B are diagrams depicting a leadframe according to a first embodiment.

As noted above, leadframes include a product region and a non-product region. According to conventional leadframes, the product region and the non-product region have the same thickness. Therefore, when the thickness of the entire leadframe is reduced to produce thinner semiconductor devices, the leadframe may be reduced in stiffness to deform. Therefore, it has been studied to reduce the thickness of the entire leadframe while ensuring the stiffness of the leadframe by designing the shape of the leadframe or using a harder material for the leadframe.

Changing the shape or material of the leadframe, however, may affect the performance of finished semiconductor devices. Therefore, it is not easy to effect such changes, and eventually, it has been difficult to reduce the thickness of the leadframe while maintaining the stiffness of the leadframe.

According to an aspect of the present invention, a leadframe reduced in thickness while maintaining stiffness is provided.

Preferred embodiments of the present invention will be explained with reference to accompanying drawings. In the drawings, the same configuration is referred to using the same reference numeral, and a repetitive description thereof may be omitted.

[a] First Embodiment

Figure 1B:
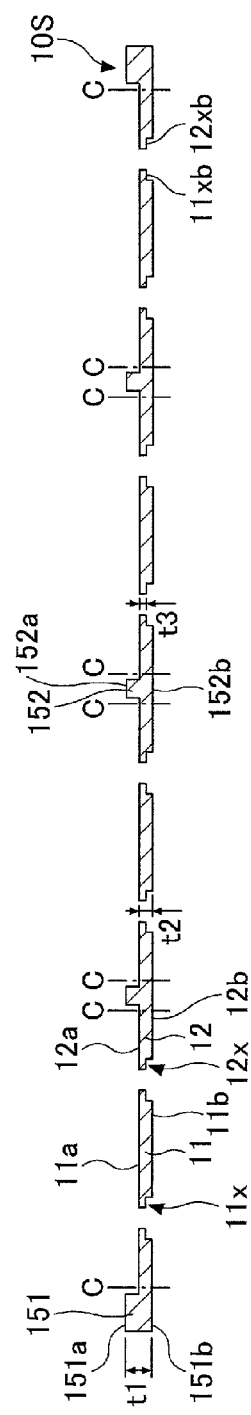

First, a leadframe structure according to a first embodiment is described. FIG. 1A is a plan view of a leadframe according to the first embodiment. FIG. 1B is a cross-sectional view of the leadframe taken along a line A-A in FIG. 1A. The plan view of FIG. 1A is provided with hatching lines corresponding to those in FIG. 1B to facilitate understanding of the drawings.

Referring to FIGS. 1A and 1B, a leadframe 10S includes multiple individual regions C that are arranged in a matrix to be connected by a connecting part 15. After semiconductor chips are mounted on the leadframe 10S and encapsulated in resin, each of the individual regions C is cut out from the leadframe 10S to become part of a semiconductor device. Suitable materials for the leadframe 10S include, for example, metal materials, such as copper (Cu), copper alloys, and alloy 42 (an iron-nickel [Fe—Ni] alloy). Part or the entirety of a surface of the leadframe 10S may be plated with a metal film such as a silver (Ag) film, a gold (Au) film, a Ni/Au film (a laminated metal film of a Ni film and a Au film stacked in this order), or a Ni/Pd/Au film (a laminated metal film of a Ni film, a palladium [Pd] film, and a Au film stacked in this order).

A die pad 11 (a chip mounting part) on which a semiconductor chip is to be mounted and multiple leads 12 (terminal parts) are provided in each individual region C. A peripheral edge of a lower surface 11b of the die pad 11 is stepped to form a step part 11x. In other words, the lower surface 11b of the die pad 11 (except for the step part 11x) is smaller in area than an upper surface 11a of the die pad 11. A peripheral edge of a lower surface 12b of each lead 12 except for a portion connected to an outer frame part 151 or a dam bar 152 of the connecting part 15 is stepped to form a step part 12x. In other words, the lower surface 12b of the lead 12 (except for the step part 12x) is smaller in area than an upper surface 12a of the lead 12. When semiconductor chips are mounted on the leadframe 10S and encapsulated in resin, the resin runs around the peripheral edges of the die pad 11 and the leads 12 to enter the step parts 11x and 12x to prevent the die pad 11 and the leads 12 from coming off of the resin.

The connecting part 15 includes the outer frame part 151 and the dam bar 152. The outer frame part 151 has a frame shape and forms a peripheral edge portion of the leadframe 10S to support the individual regions C through their respective peripheral edges. The dam bar 152 has a grid shape and is connected to the outer frame part 151 to be positioned among the individual regions C within the outer frame part 151. The connecting part 15 further includes support bars 153 that are diagonally arranged in each individual region C. Each support bar 153 has a first end connected to the outer frame part 151 and/or the dam bar 152 and has a second end connected to one of the four corners of the die pad 11 to support the die pad 11. Each support bar 153 is half-etched on its bottom (lower) side to have substantially the same thickness as the step parts 11x and 12x. The leads 12 extend from the outer frame part 151 or the dam bar 152 toward each die pad 11 to surround each die pad 11.

According to the leadframe 10S, the outer frame part 151 and the dam bar 152 are thicker than the die pads 11, the leads 12, and the support bars 153. A thickness t1 of the outer frame part 151 and the dam bar 152 may be, for example, approximately 200 μm. A thickness t2 of the die pads 11 and the leads 12 may be, for example, approximately 100 A thickness t3 of the step parts 11x of the die pads 11, the step parts 12x of the leads 12, and the support bars 153 may be, for example, approximately 50 μm.

According to the leadframe 10S, an upper surface 151a of the outer frame part 151 and an upper surface 152a of the dam bar 152 are in the same plane. The upper surfaces 11a of the die pads 11, the upper surfaces 12a of the leads 12, and upper surfaces 153a of the support bars 153 are in the same plane. Lower surfaces 11xb of the step parts 11x, lower surfaces 12xb of the step parts 12x, and lower surfaces (not illustrated) of the support bars 153 are in the same plane. A lower surface 151b of the outer frame part 151, a lower surface 152b of the dam bar 152, the lower surfaces 11b of the die pads 11 (except for the step parts 11x), and the lower surfaces 12b of the leads 12 (except for the step parts 12x) are in the same plane.

Furthermore, the interval (depth) from the upper surface 151a of the outer frame part 151 and the upper surface 152a of the dam bar 152 to the upper surfaces 11a of the die pads 11, the upper surfaces 12a of the leads 12, and the upper surfaces 153a of the support bars 153 is greater than the interval (depth) from the lower surfaces 11xb of the step parts 11x, the lower surfaces 12xb of the step parts 12x, and the lower surfaces (not depicted) of the support bars 153 to the lower surface 151b of the outer frame part 151, the lower surface 152b of the dam bar 152, the lower surfaces 11b of the die pads 11 (except for the step parts 11x), and the lower surfaces 12b of the leads 12 (except for the step parts 12x). The thickness t3 of the step parts 11x, the step parts 12x, and the support bars 153 is smaller than the thickness t2 of the die pads 11 and the leads 12.

Figures 2A, 2B:
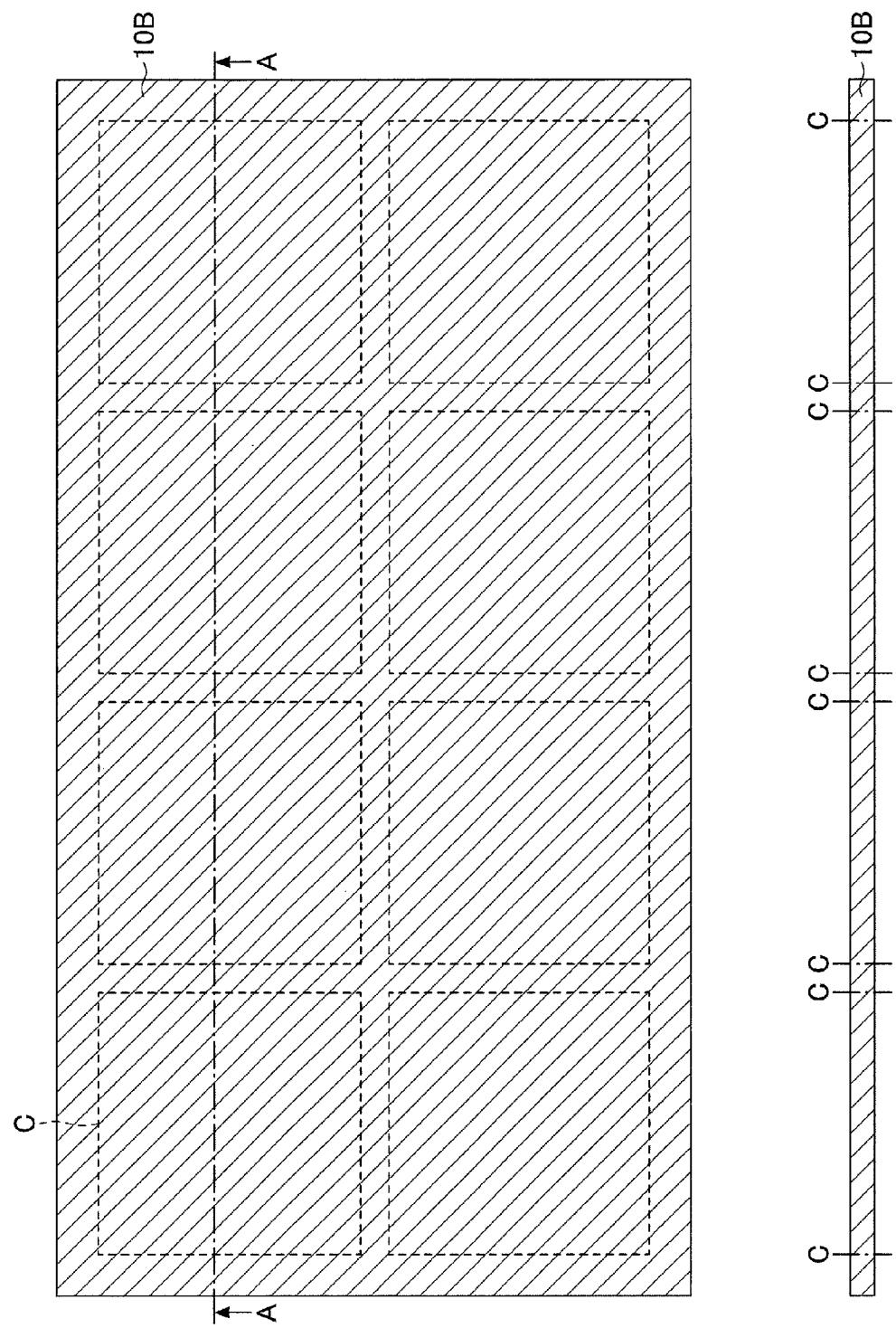
FIGS. 2A and 2B are diagrams depicting a process of manufacturing a leadframe according to the first embodiment.

Next, a method of manufacturing a leadframe according to the first embodiment is described. FIGS. 2A through 8B are diagrams depicting a process of manufacturing a leadframe according to the first embodiment. First, in the process depicted in FIGS. 2A and 2B, a metal plate 10B ("plate 10B") having a predetermined shape is prepared. FIG. 2A is a plan view of the plate 10B. FIG. 2B is a cross-sectional view of the plate 10B, taken along a line A-A in FIG. 2A. The plan view of FIG. 2A is provided with hatching lines corresponding to those in FIG. 2B to facilitate understanding of the drawings. The plate 10B includes multiple regions to become the individual regions C. Suitable materials for the plate 10B include, for example, copper, copper alloys, and alloy 42. The thickness of the plate 10B may be, for example, approximately 200 μm.

Figure 3A:
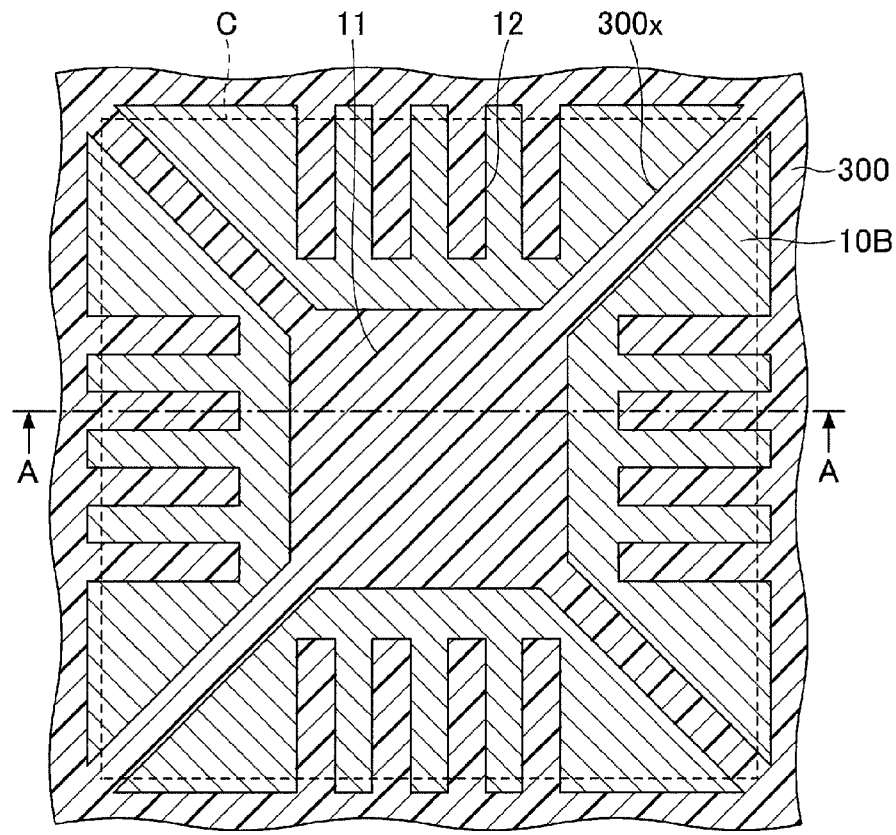
FIGS. 3A and 3B are diagrams depicting the process of manufacturing a leadframe according to the first embodiment.
Figure 3B:
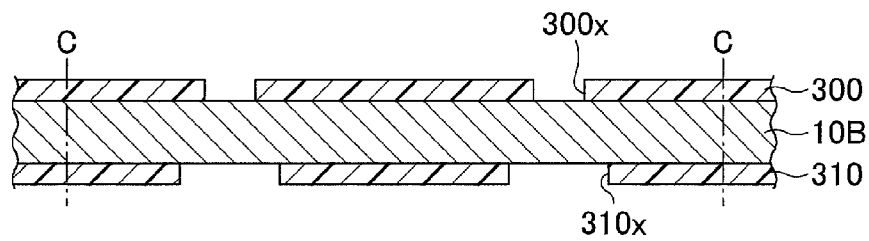

Next, in the process depicted in FIGS. 3A and 3B, a photoresist 300 ("resist 300") and a photoresist 310 ("resist 310") are formed on an upper surface and a lower surface, respectively, of the plate 10B. Then, the resists 300 and 310 are exposed to light and developed to form openings 300x and 310x at predetermined positions in the resists 300 and 310, respectively. The openings 300x and 310x are openings for forming the die pads 11, the leads 12, the step parts 11x and 12x, and the connecting part 15 in the plate 10B.

FIG. 3A is a plan view of one of the individual regions C of FIGS. 2A and 2B. FIG. 3B is a cross-sectional view of one of the individual regions C, taken along a line A-A in FIG. 3A. The plan view of FIG. 3A is provided with hatching lines corresponding to those in FIG. 3B to facilitate understanding of the drawings. The same is the case with FIGS. 4A through 8B.

Figure 4A:
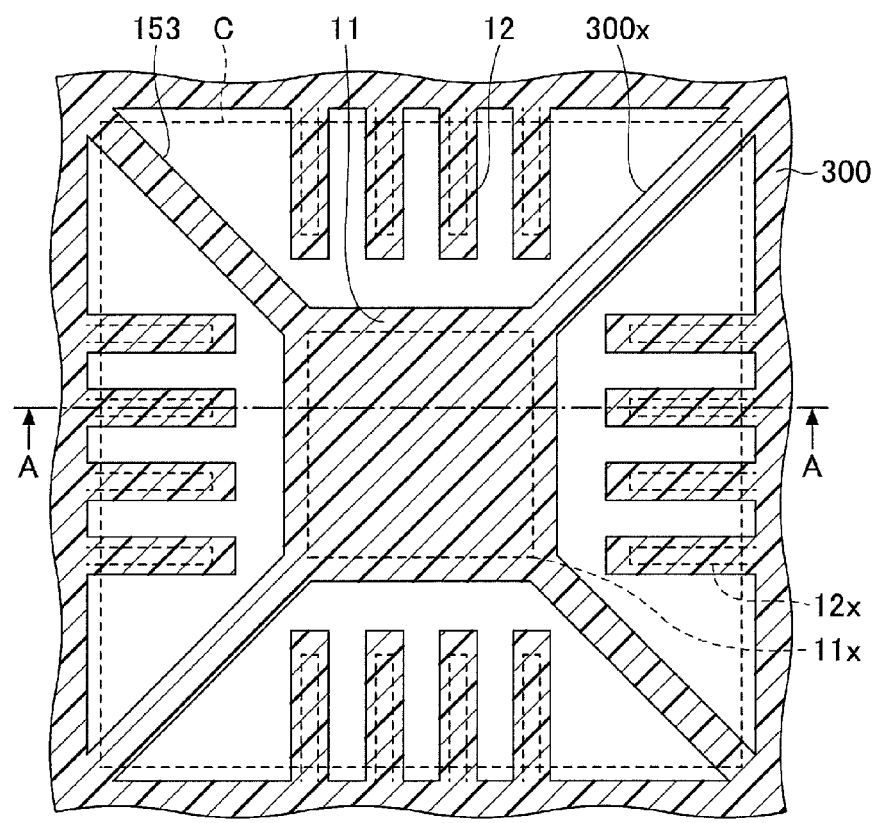
FIGS. 4A and 4B are diagrams depicting the process of manufacturing a leadframe according to the first embodiment.
Figure 4B:
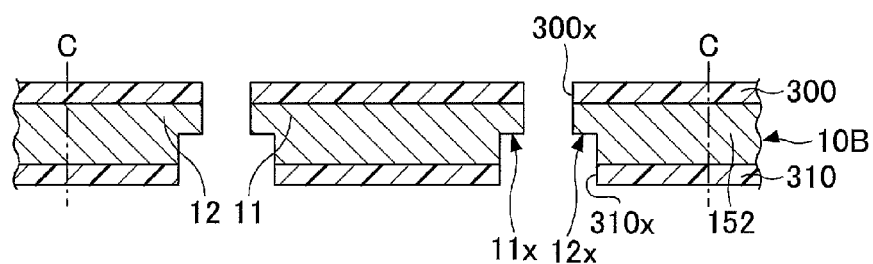
Figure 5A:
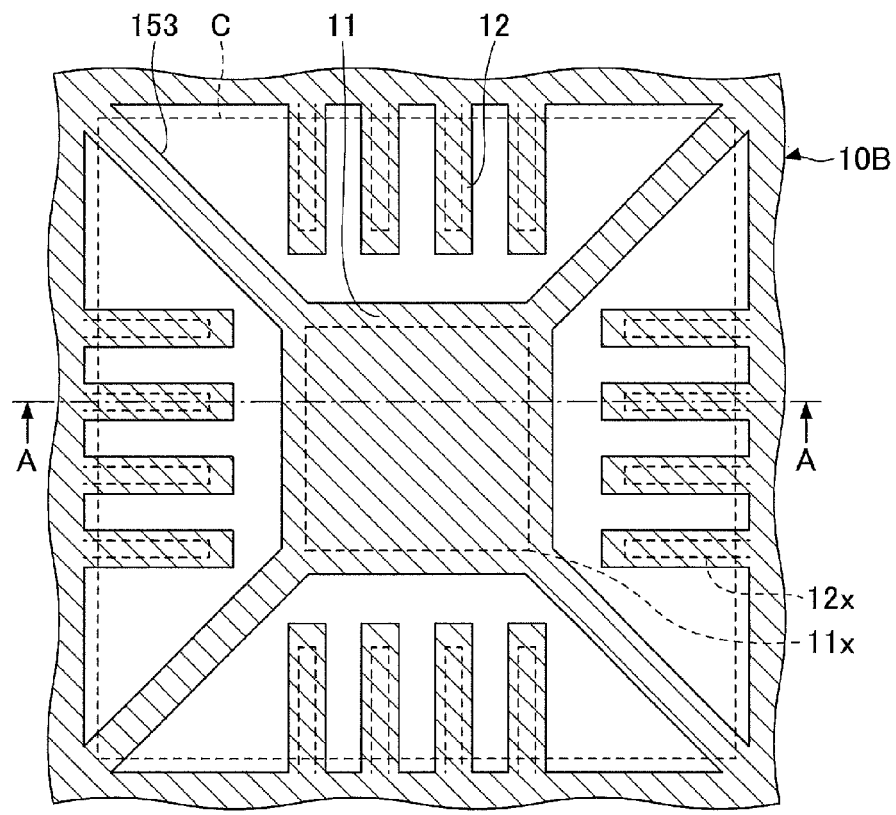
FIGS. 5A and 5B are diagrams depicting the process of manufacturing a leadframe according to the first embodiment.
Figure 5B:
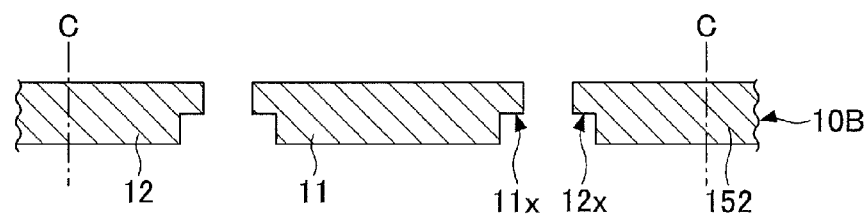

Next, in the process depicted in FIGS. 4A and 4B, the resists 300 and 310 are used as etching masks to etch the plate 10B. Where the openings 300x and 310x are positioned one over the other in a plan view, the plate 10B is pierced through to form the die pads 11, the leads 12, and the connecting part 15. Furthermore, where only the openings 310x are formed (that is, where the openings 310x extend beyond the openings 300x) in a plan view, the lower surface of the plate 10B is half-etched to form the step parts 11x and 12x. Lower surfaces of portions of the plate 10B to become the support bars 153 are exposed in the openings 310x. In these portions, only the lower surface of the plate 10B is half-etched to form the support bars 153 having substantially the same thickness as the step parts 11x and 12x. Next, in the process depicted in FIGS. 5A and 5B, the resists 300 and 310 depicted in FIGS. 4A and 4B are removed.

Figure 6A:
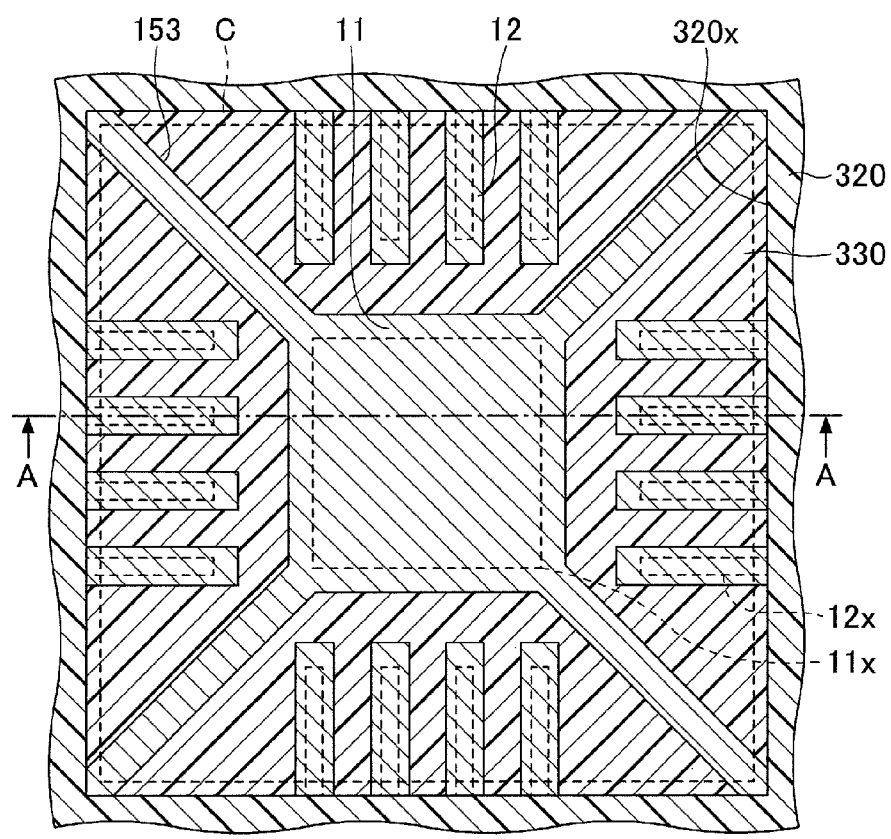
FIGS. 6A and 6B are diagrams depicting the process of manufacturing a leadframe according to the first embodiment.
Figure 6B:
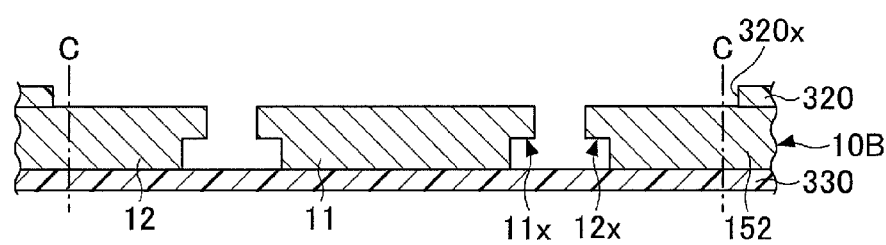

Next, in the process depicted in FIGS. 6A and 6B, a photoresist 320 ("resist 320") and a photoresist 330 ("resist 330") are formed on the upper surface and the lower surface, respectively, of the plate 10B. Then, the resist 320 is exposed to light and developed to form openings 320x at predetermined positions in the resist 320. The openings 320x are openings for reducing the thickness of the plate 10B by partially etching the upper surface of the plate 10B. No openings have to be formed in the resist 330, but openings having the same shape as the openings 310x may be formed in the resist 330 at the same positions as the openings 310x depicted in FIGS. 4A and 4B.

Thus, the resist 320 (a first resist) is formed to expose the upper surfaces 11a of the die pads 11, the upper surfaces 12a of the leads 12, and the upper surfaces 153a of the support bars 153 and cover the upper surface 151a of the outer frame part 151 and the upper surface 152a of the dam bar 152. Furthermore, the resist 330 (a second resist) is formed to cover the lower surfaces 11b of the die pads 11, the lower surfaces 12b of the leads 12, and a lower surface of the connecting part 15.

Figure 7A:
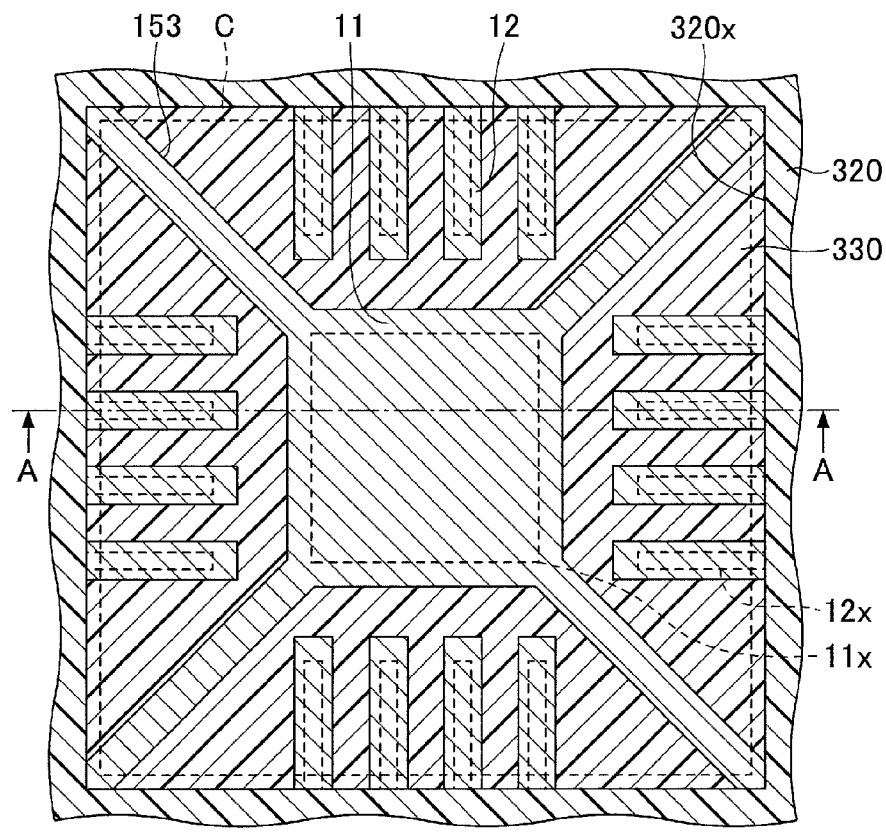
FIGS. 7A and 7B are diagrams depicting the process of manufacturing a leadframe according to the first embodiment.
Figure 7B:
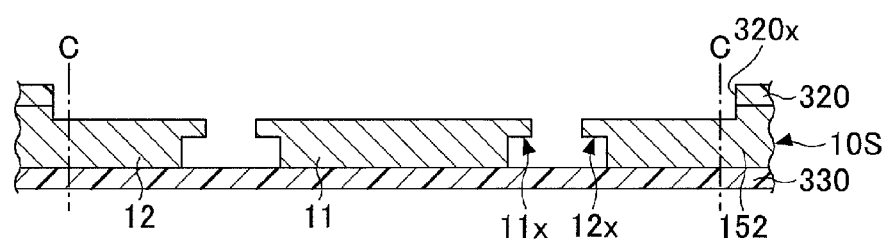

Next, in the process depicted in FIGS. 7A and 7B, the resists 320 and 330 are used as etching masks to etch the plate 10B. Where the openings 320x are formed, only the upper surface of the plate 10B is etched to reduce the thickness of the plate 10B. Specifically, only the die pads 11, the leads 12, and the support bars 153 are reduced in thickness, while the outer frame part 151 and the dam bar 152 have the same thickness as the plate 10B. Etching conditions may be controlled to provide the die pads 11, the leads 12, and the support bars 153 with a desired thickness. Next, in the process depicted in FIGS. 8A and 8B, the resists 320 and 330 depicted in FIGS. 7A and 7B are removed. As a result, the leadframe 10S is completed.

Figure 8A:
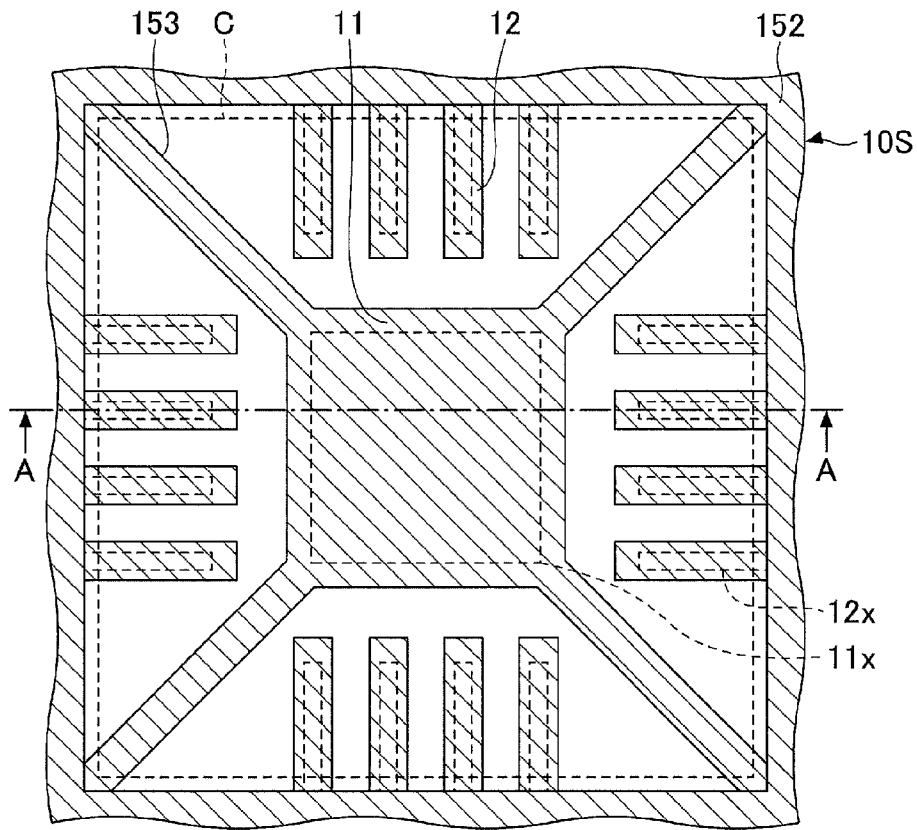
FIGS. 8A and 8B are diagrams depicting the process of manufacturing a leadframe according to the first embodiment.
Figure 8B:
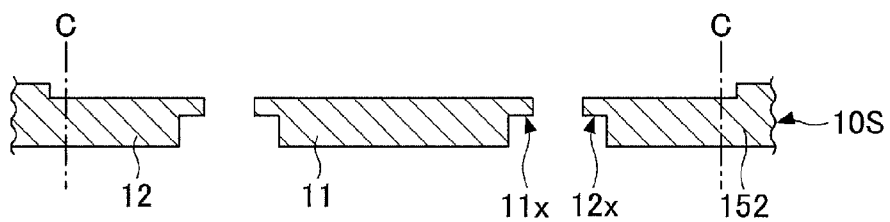

After the process depicted in FIGS. 8A and 8B, a desired portion of the leadframe 10S may be plated with a metal film such as a Ag film, a Au film, a Ni/Au film, or a Ni/Pd/Au film. For example, the upper surfaces 12a of the leads 12 may be plated with silver for better wire bondability.

Thus, of the leadframe 10S according to the first embodiment, a non-product portion, or a portion to be ultimately removed and not to become products (semiconductor devices), is thicker than a product portion, or a portion to ultimately become products (semiconductor devices). Thus, according to the leadframe 10S of the first embodiment, it is possible to reduce the thickness of the product portion while maintaining high stiffness. As a result, semiconductor devices, which are final products, can be reduced in thickness.

Furthermore, a technique to complicate the shape of a leadframe or change the material of a leadframe to a harder material is not employed to maintain the stiffness of the leadframe 10S, thus exerting no influence over the performance of the completed semiconductor devices.

Furthermore, according to the leadframe 10S of the first embodiment, it is possible to reduce the thickness of the product portion as desired. Accordingly, it is possible to manufacture semiconductor devices with a leadframe whose thickness is not commercially common.

According to this embodiment, the outer frame part 151 and the dam bar 152 are the non-product portion, and the die pads 11, the leads 12, and the support bars 153 are the product portion.

[b] Second Embodiment

According to a second embodiment, a leadframe is partially reduced in thickness by a manufacturing method different from that of the first embodiment. In the second embodiment, a description of the same configurations as those of the above-described embodiment may be omitted.

Figure 9A:
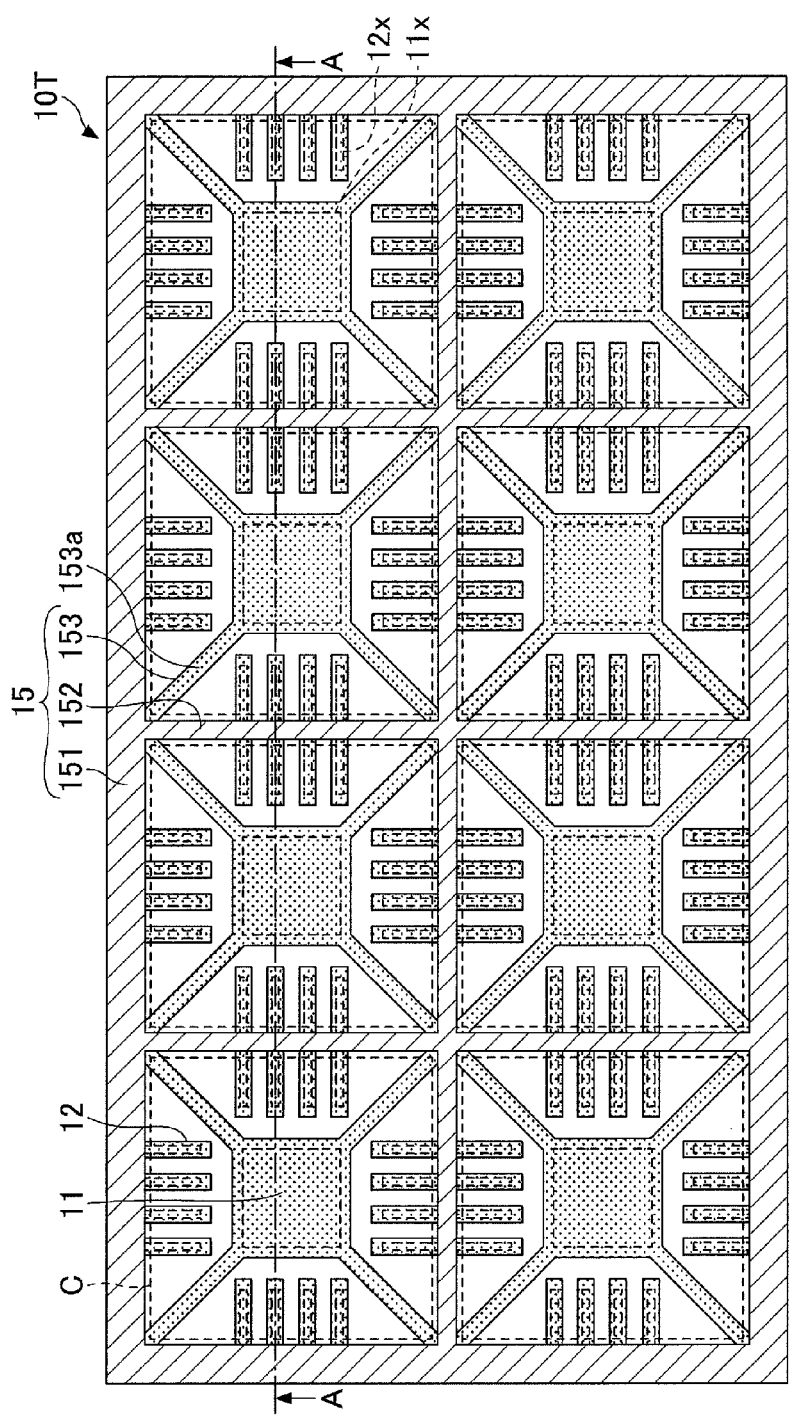
FIGS. 9A and 9B are diagrams depicting a leadframe according to a second embodiment.
Figure 9B:
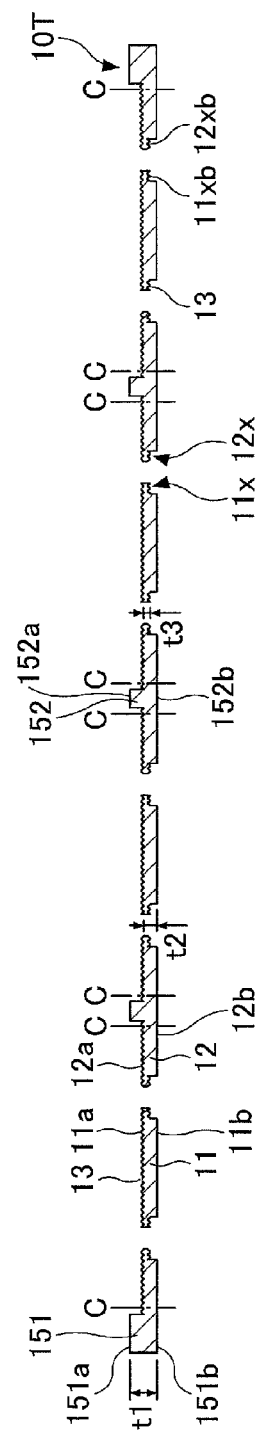

First, a structure of a leadframe according to the second embodiment is described. FIG. 9A is a plan view of a leadframe according to the second embodiment. FIG. 9B is a cross-sectional view of the leadframe taken along a line A-A in FIG. 9A. The plan view of FIG. 9A is provided with hatching lines corresponding to those in FIG. 9B to facilitate understanding of the drawings.

Referring to FIGS. 9A and 9B, a leadframe 10T is the same as the leadframe 10S (see FIGS. 1A and 1B) in that the outer frame part 151 and the dam bar 152 are thicker than the die pads 11, the leads 12, and the support bars 153. The leadframe 10T, however, is different from the leadframe 10S in that an uneven surface part 13 is formed in the upper surfaces 11a, 12a, and 153a of the thinned die pads 11, leads 12, and support bars 153, respectively, the lower surfaces 11xb and 12xb of the step parts 11x and 12x, respectively, (a half-etched portion of a lower surface of the leadframe 10T), and the lower surfaces (not depicted) of the support bars 153. A region in which the uneven surface part 13 is provided is schematically indicated by a dotted pattern in FIG. 9A and by a corrugated line in FIG. 9B.

The uneven surface part 13 is, for example, where fine depressions (dimples) having a substantially circular planar shape are vertically and laterally arranged at high density. The uneven surface part 13 may have depressions regularly arranged. For example, the uneven surface part 13 may have depressions arranged like a lattice such as a face-centered lattice.

The diameter of the depressions is preferably 0.020 mm to 0.060 mm, and more preferably, 0.020 mm to 0.040 mm. The pitch of the depressions is preferably 0.040 mm to 0.080 mm. The depth of the depressions is preferably approximately 35% to approximately 70% of the thickness of the leadframe 10T, and may be, for example, approximately 0.010 mm to approximately 0.050 mm.

According to the uneven surface part 13, the planar shape of the depressions is not limited to a substantial circle, and may be, for example, a polygon such as a hexagon. In this case, the diameter of the circumcircle of a polygon is preferably 0.020 mm to 0.060 mm, and more preferably, 0.020 mm to 0.040 mm. The pitch of the circumcircles is preferably 0.040 mm to 0.080 mm.

Figure 10:
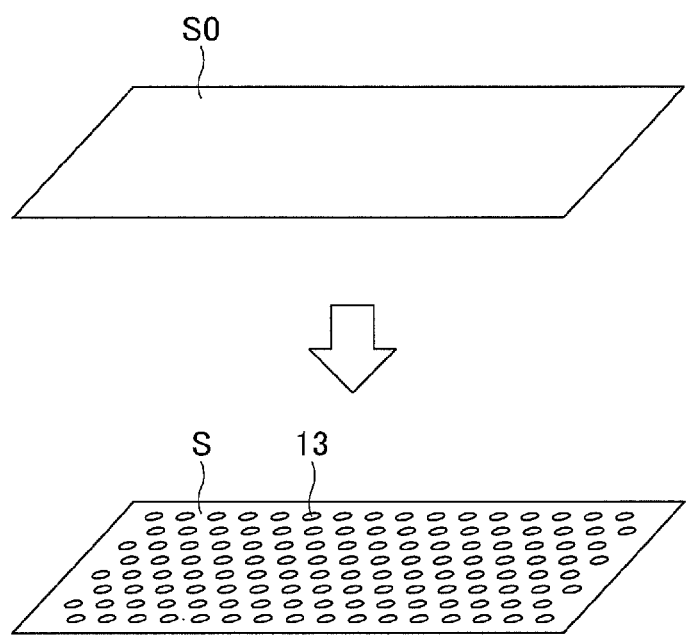
FIG. 10 is a diagram illustrating an S ratio.

According to embodiments of the present invention, the term "uneven surface part" refers to a part where the planar shape of depressions formed in a surface is a circle whose diameter is greater than or equal to 0.020 mm and smaller than or equal to 0.060 mm or a polygon whose circumcircle has a diameter of greater than or equal to 0.020 mm and smaller than or equal to 0.060 mm, and the S ratio of the part (uneven surface part) is 1.7 or more. Here, the S ratio refers to the ratio of S to S0, where S0 is the surface area of a planar surface and S is the surface area of the uneven surface part formed in the planar surface as depicted in FIG. 10. That is, the S ratio is S/S0. A surface of the uneven surface part may be plated with, for example, silver. In this case, S is the area of the plated surface of the uneven surface part.

If the diameter of the depressions or the diameter of the circumcircle of the polygon is smaller than 0.020 mm or greater than 0.060 mm, it is difficult to increase the S ratio, so that adhesion to resin does not increase.

The uneven surface part 13 is thus provided to increase the surface area of a part that contacts resin when semiconductor chips are mounted on the leadframe 10T to be encapsulated in resin. This produces an anchoring effect to increase adhesion between the leadframe 10T and resin. As a result, it is possible to prevent delamination of the leadframe 10T and resin at their interface. Furthermore, the uneven surface part 13 is also formed in the lower surfaces 11xb and 12xb of the step parts 11x and 12x and the lower surfaces (not depicted) of the support bars 153 to further increase adhesion to resin. The S ratio of a conventional uneven surface part is approximately 1 to approximately 1.2, with which it is difficult to ensure sufficient adhesion to resin.

Suitable materials for the leadframe 10T include, for example, copper, copper alloys, and alloy 42. An upper surface, etc., of the leadframe 10T may be plated with, for example, silver to increase wire bondability or the like. The thickness of silver plating is normally approximately 2 μm to approximately 6 μm. Even with silver plating, the uneven surface part 13 does not become flat and maintains the S ratio at substantially the same level as before plating. Therefore, even in the case of plating the upper surface, etc., of the leadframe 10T with silver, it is possible to increase adhesion between the leadframe 10T and resin.

It is also possible to increase adhesion between the leadframe 10T and resin in the case of forming a metal film such as a Au film, a Ni/Au film, or a Ni/Pd/Au film by plating in place of a Ag film.

According to the leadframe 10T, the upper surface 151a of the outer frame part 151 and the upper surface 152a of the dam bar 152 are in the same plane. The upper surfaces 11a of the die pads 11, the upper surfaces 12a of the leads 12, and the upper surfaces 153a of the support bars 153 are in the same plane. The lower surfaces 11xb of the step parts 11x, the lower surfaces 12xb of the step parts 12x, and the lower surfaces (not depicted) of the support bars 153 are in the same plane. The lower surface 151b of the outer frame part 151, the lower surface 152b of the dam bar 152, the lower surfaces 11b of the die pads 11 (except for the step parts 11x), and the lower surfaces 12b of the leads 12 (except for the step parts 12x) are in the same plane.

Furthermore, the interval (depth) from the upper surface 151a of the outer frame part 151 and the upper surface 152a of the dam bar 152 to the upper surfaces 11a of the die pads 11, the upper surfaces 12a of the leads 12, and the upper surfaces 153a of the support bars 153 is greater than the interval (depth) from the lower surfaces 11xb of the step parts 11x, the lower surfaces 12xb of the step parts 12x, and the lower surfaces (not depicted) of the support bars 153 to the lower surface 151b of the outer frame part 151, the lower surface 152b of the dam bar 152, the lower surfaces 11b of the die pads 11 (except for the step parts 11x), and the lower surfaces 12b of the leads 12 (except for the step parts 12x). The thickness t3 of the step parts 11x, the step parts 12x, and the support bars 153 is smaller than the thickness t2 of the die pads 11 and the leads 12.

Next, a method of manufacturing a leadframe according to the second embodiment is described. FIGS. 11A through 13B are diagrams depicting a process of manufacturing a leadframe according to the second embodiment.

Figure 11A:
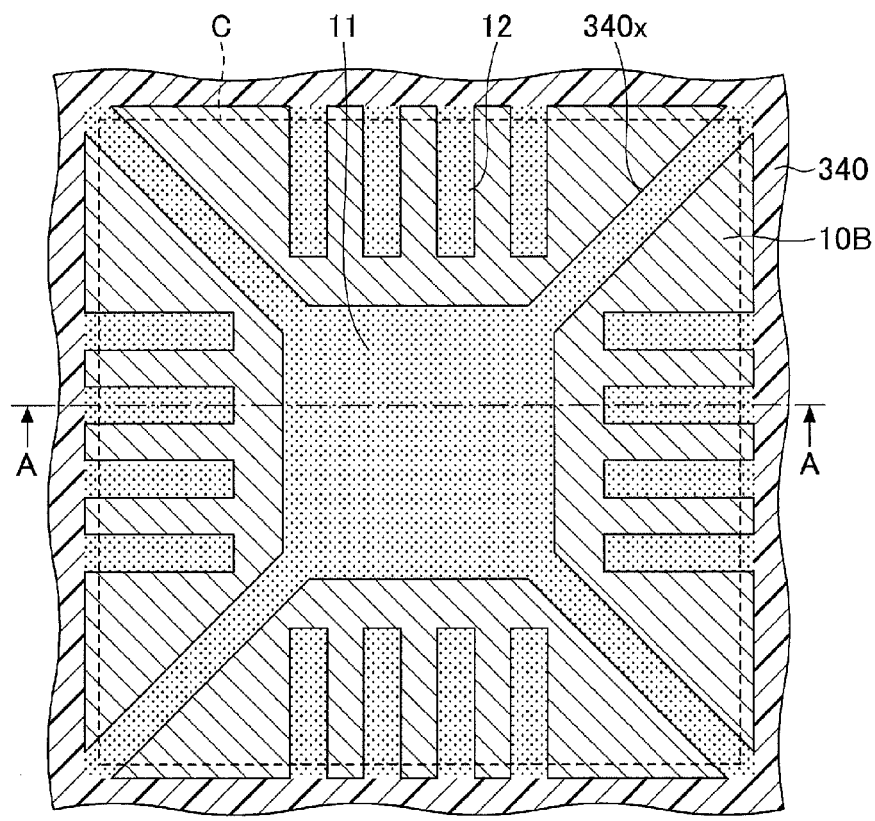
FIGS. 11A through 11D are diagrams depicting a process of manufacturing a leadframe according to the second embodiment.
Figure 11B:
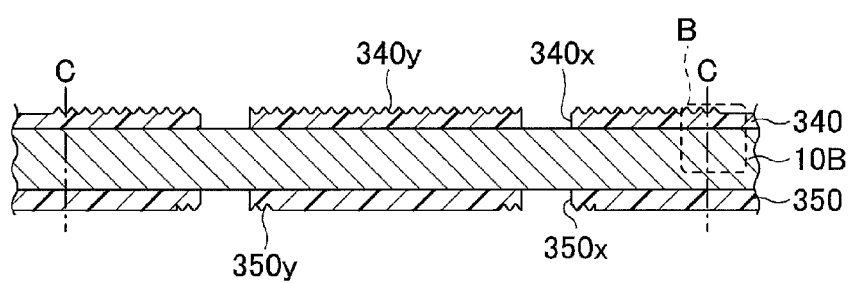
Figure 11C:
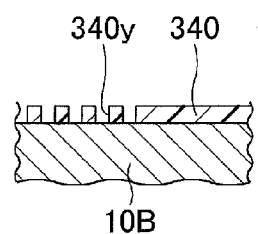
Figure 11D:
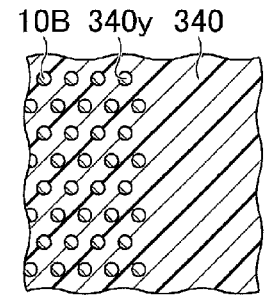
Figure 12A:
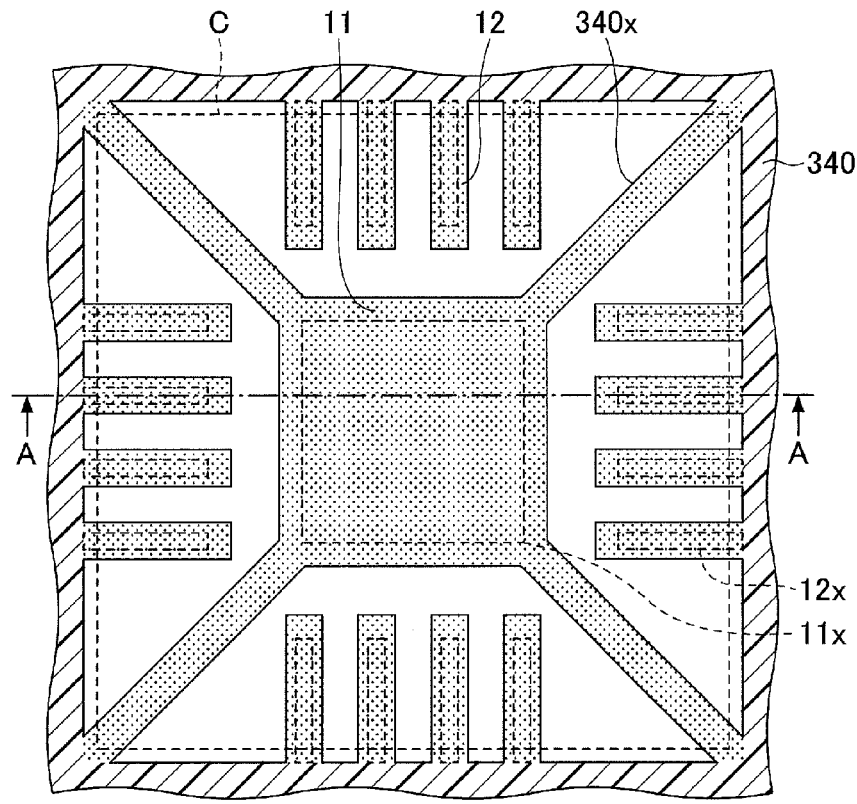
FIGS. 12A through 12D are diagrams depicting the process of manufacturing a leadframe according to the second embodiment.
Figure 12B:
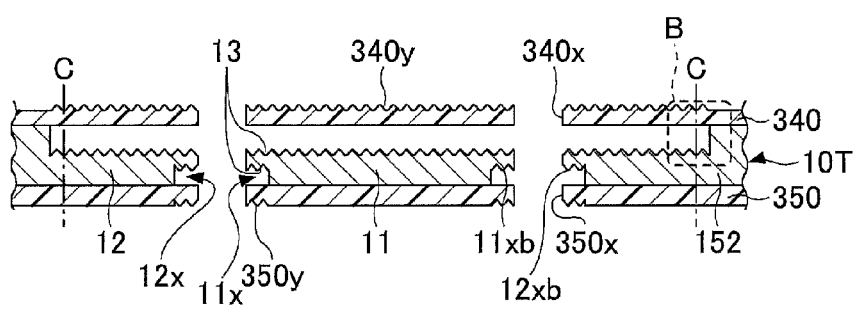
Figure 12C:
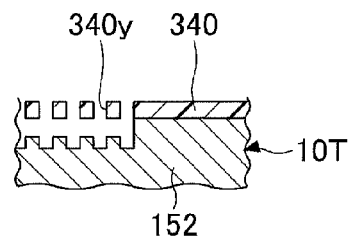
Figure 12D:
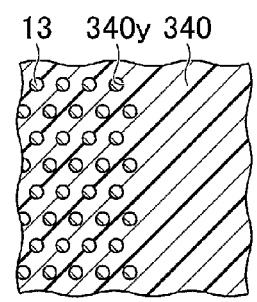

FIG. 11A is a plan view of one of the individual regions C of FIGS. 9A and 9B. FIG. 11B is a cross-sectional view of one of the individual regions C, taken along a line A-A in FIG. 11A. FIG. 11C is an enlarged cross-sectional view of part indicated by B ("part B") in FIG. 11B. FIG. 11D is an enlarged plan view of part of the part B in FIG. 11B. The plan views of FIGS. 11A and 11D are provided with hatching lines corresponding to those in the cross-sectional view of FIG. 11B to facilitate understanding of the drawings. A region in which openings 340y for forming the uneven surface part 13 are provided is schematically indicated by a dotted pattern in FIG. 11A and by a corrugated line in FIG. 11B. The same is the case with FIGS. 12A, 12B, 12C and 12D and FIGS. 13A, 13B, 13C and 13D.

First, in the process depicted in FIGS. 11A through 11D, the metal plate 10B having a predetermined shape as depicted in FIGS. 2A and 2B is prepared, and a photoresist 340 ("resist 340") and a photoresist 350 ("resist 350") are formed on the upper surface and the lower surface, respectively, of the plate 10B. Then, the resists 340 and 350 are exposed to light and developed to form openings 340x and the openings 340y and openings 350x and 350y at predetermined positions in the resists 340 and 350, respectively.

The openings 340x and 350x are openings for forming the die pads 11, the leads 12, and the connecting part 15 in the plate 10B, and are positioned one over the other in a plan view. The openings 340y are openings for forming the uneven surface part 13 and reducing the thickness of the plate 10B on its upper side, and are provided on upper surfaces of portions of the plate 10B to become the die pads 11, the leads 12, and the support bars 153. The openings 350y are openings for forming the uneven surface part 13 and reducing the thickness of the plate 10B on its lower side, and are provided where the step parts 11x and 12x are to be formed and where the support bars 153 are to be formed.

The openings 340y and 350y are, for example, multiple circular openings that are vertically and laterally arranged. The diameter of the circular openings is preferably 0.020 mm to 0.060 mm, and more preferably, 0.020 mm to 0.040 mm. The planar shape of the openings 340y and 350y is not limited to a circle, and may be, for example, a polygon such as a hexagon. In this case, the diameter of the circumcircle of a polygon is preferably 0.020 mm to 0.060 mm, and more preferably, 0.020 mm to 0.040 mm. The individual regions C become covered regions covered with resin 40 (encapsulation resin) after mounting semiconductor chips in the individual regions C. The uneven surface part 13 is formed in at least part of the covered regions.

Thus, the resist 340 (a first resist) is formed to cover upper surfaces of portions of the plate 10B to become the die pads 11, the leads 12, and the support bars 153 and upper surfaces of portions of the plate 10B to become the outer frame part 151 and the dam bar 152. The openings 340y are formed in a region of the resist 340 that covers the upper surfaces of the portions to become the die pads 11, the leads 12, and the support bars 153.

Furthermore, the resist 350 (a second resist) is formed to cover lower surfaces of the portions to become the die pads 11, the leads 12, and the support bars 153 and lower surfaces of the portions to become the outer frame part 151 and the dam bar 152. The openings 350y are formed in a region of the resist 350 that covers the lower surfaces of the portions to become the step parts 11x, the step parts 12x, and the support bars 153.

Next, in the process depicted in FIGS. 12A through 12D, the resists 340 and 350 are used as etching masks to perform etching (such as wet etching) on the plate 10B. Then, in the process depicted in FIGS. 13A through 13D, the resists 340 and 350 depicted in FIGS. 12A through 12D are removed. As a result, the leadframe 10T is completed.

Where the openings 340x and 350x are positioned one over the other in a plan view, the plate 10B is pierced through.

In a part of the plate 10B over which the openings 340y are formed, the plate 10B is partly prevented from being etched at the beginning of etching because the entry of an etchant is restricted around each circular opening (where the resist 340 is formed). Thereafter, from the middle to the end of etching, the etchant enters the plate 10B through the periphery of each opening to corrode the entire part of the plate 10B over which the openings 340y are formed. As a result, openings shallower at the peripheral edge than in the center are etched in the part of the plate 10B. The etched openings are depressions, depressed relative to their periphery, having a circular planar shape. As a result, the uneven surface part 13 is formed, and the entire part of the plate 10B over which the openings 340y are formed is reduced in thickness.

That is, the upper surfaces 11a of the die pads 11, the upper surfaces 12a of the leads 12, and the upper surfaces 153a of the support bars 153, over which the openings 340y are formed, are depressed relative to the upper surface 151a of the outer frame part 151 and the upper surface 152a of the dam bar 152, over which no openings are formed. Thus, the plate 10B is reduced in thickness where the die pads 11, the leads 12, and the support bars 153 are formed.

Furthermore, in a part of the plate 10B where the openings 350y are formed, the uneven surface part 13 is formed and the thickness is reduced as in a part of the plate 10B where the openings 340y are formed. That is, the lower surfaces 11xb of the step parts 11x, the lower surfaces 12xb of the step parts 12x, and the lower surfaces (not depicted) of the support bars 153, over which the openings 350y are formed, are depressed relative to lower surfaces of parts of the plate 10B over which no openings are formed. Thus, the step parts 11x and 12x are formed and the plate 10B is reduced in thickness where the support bars 153 are formed, and the uneven surface part 13 is formed in the lower surfaces 11xb and 12xb of the step parts 11x and 12x and the lower surfaces (not depicted) of the support bars 153.

One or more of the planar shape, the size, and the pitch of the openings 340y and 350y may be changed to vary the shape and the depth of the depressions of the uneven surface part 13. Furthermore, by changing one or more of the planar shape, the size, and the pitch of the openings 340y and 350y, the amount of etching changes, and therefore, the thickness t2 of the die pads 11 and the leads 12 and the thickness t3 of the step parts 11x and 12x and the support bars 153 can be reduced to a desired value.

Furthermore, by changing one or more of the planar shape, the size, and the pitch of the openings 350y, the lower surfaces 11xb and 12xb of the step parts 11x and 12x and the lower surfaces (not depicted) of the support bars 153 can be formed flat by half-etching. That is, it is possible to perform half-etching without forming the uneven surface part 13. For example, it is possible to form a flat half-etched surface by causing the openings 350y to form a checkered resist pattern as depicted in FIG. 17B.

Figure 13A:
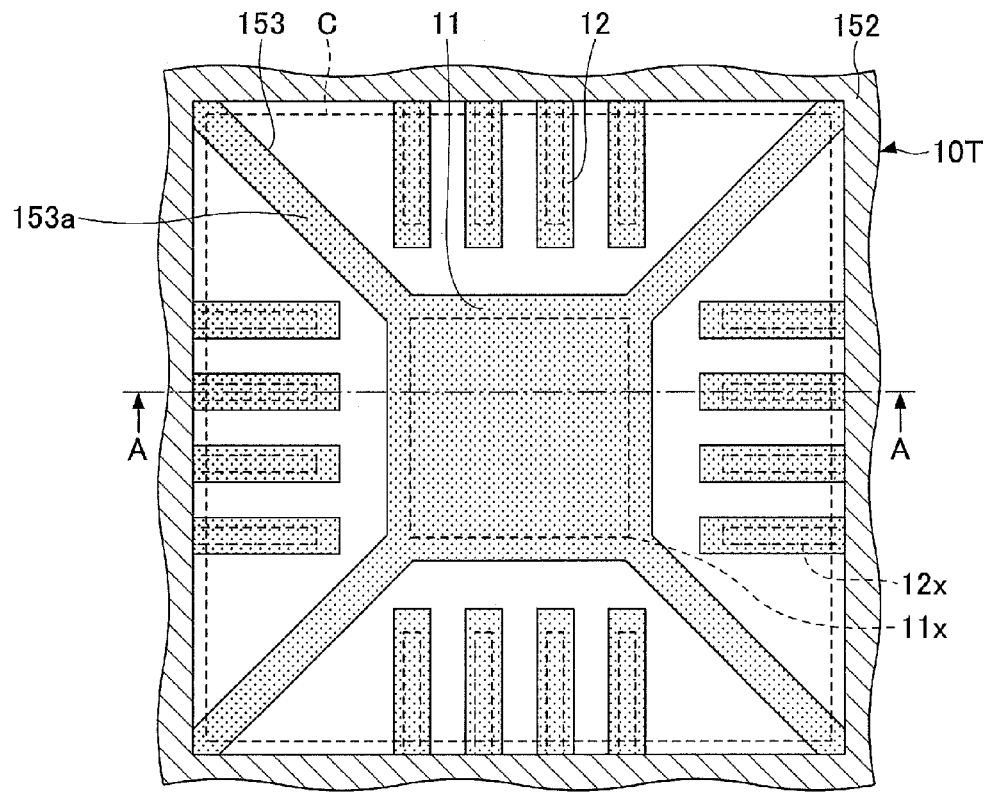
FIGS. 13A through 13D are diagrams depicting the process of manufacturing a leadframe according to the second embodiment.
Figure 13B:
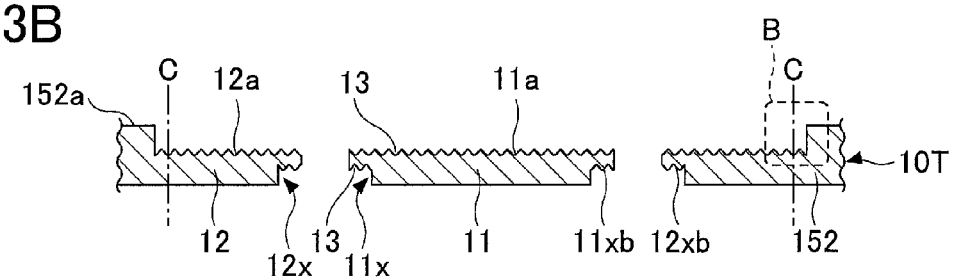
Figure 13C:
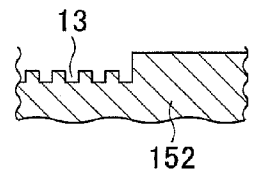
Figure 13D:
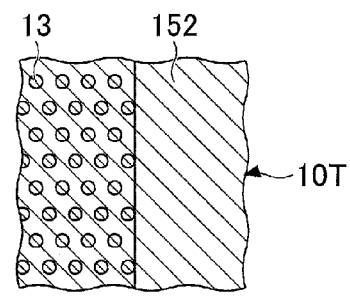

Referring to FIG. 13C, depressions of the uneven surface part 13 are depicted as having a rectangular cross section, while the depressions are practically formed to have a concave cross section whose bottom curves downward (inward).

After the process depicted in FIGS. 13A through 13D, a desired portion of the leadframe 10T may be plated with a metal film such as a Ag film, a Au film, a Ni/Au film, or a Ni/Pd/Au film. For example, the upper surfaces 12a of the leads 12 may be plated with silver for better wire bondability.

The high-density uneven surface part 13 can also be formed in wire bonding regions of the upper surfaces 12a of the leads 12 without hindering wire bonding. In this case, the uneven surface part 13 in the wiring bonding regions of the upper surfaces 12a of the leads 12 may be plated with, for example, silver for better wire bondability, and it is possible to ensure adhesion to resin even with plating such as silver plating.

The description goes on to describe a process of manufacturing a semiconductor device. FIGS. 14A through 14D are diagrams depicting a process of manufacturing a semiconductor device according to this embodiment. First, in the process depicted in FIG. 14A, a semiconductor chip 20 is mounted face up on the die pad 11 of each individual region C. The semiconductor chip 20 may be mounted on the die pad 11 through an adhesive (not depicted) such as a die attach film (a die bonding process). In this case, heating is performed up to a predetermined temperature to harden the die attach film. The semiconductor chip 20 may alternatively be mounted on the die pad 11 using adhesive paste in lieu of a die attach film.

Providing the uneven surface part 13 in the upper surface 11a of the die pad 11 makes it possible to increase the bonding strength of the semiconductor chip 20 bonded onto the upper surface 11a of the die pad 11 with an adhesive through the anchoring effect of the adhesive.

Figure 14A:
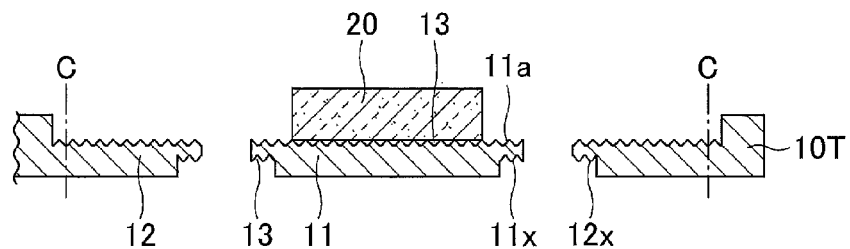
FIGS. 14A through 14D are diagrams depicting a process of manufacturing a semiconductor device using the leadframe according to the second embodiment.
Figure 14B:
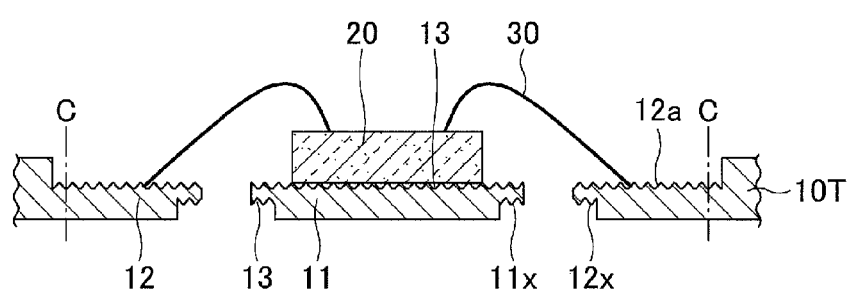

Next, in the process depicted in FIG. 14B, electrode terminals formed on an upper surface of the semiconductor chip 20 are electrically connected to the leads 12 via metal wires 30 (connecting members) such as gold wires or copper wires. The metal wires 30 may be connected to electrode terminals of the semiconductor chip 20 and the leads 12 by, for example, wire bonding. At this point, wire bonding portions of the leads 12 may be plated with, for example, silver (not depicted) to improve the bondability (wire bondability) of the metal wires 30.

According to this embodiment, the uneven surface part 13 is also formed in regions of the upper surfaces 12a of the leads 12 that are connected to the metal wires 30. Depending on the condition of connection (the condition of wire bonding) to the metal wires 30, however, it may be preferable to omit the uneven surface part 13. In such a case, the uneven surface part 13 does not have to be formed in regions of the upper surfaces 12a of the leads 12 that are connected to the metal wires 30.

Figure 14C:
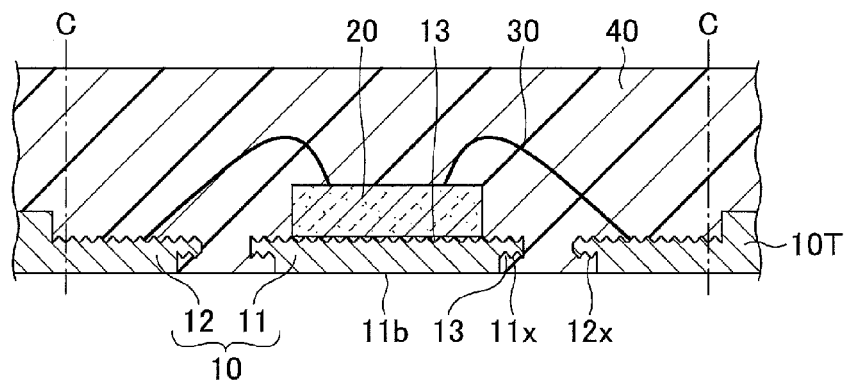

Next, in the process depicted in FIG. 14C, the leadframe 10T, the semiconductor chip 20, and the metal wires 30 are encapsulated in resin 40 by, for example, transfer molding or compression molding. The resin 40 may be, for example, a so-called mold resin that is epoxy resin containing a filler.

A protection tape or the like is applied to the lower surface of the leadframe 10T to prevent the resin 40 from extending over to the lower surface of the leadframe 10T when the leadframe 10T is encapsulated in the resin 40. Because the uneven surface part 13 is not formed in the lower surface of the leadframe 10T, a protection tape or the like can be applied without a gap to the lower surface of the leadframe 10T to ensure prevention of extension of the resin 40.

In view of ensuring application of a protection film or the like, for example, only a peripheral edge of the lower surface 11b of the die pad 11 may be made flat, and the uneven surface part 13 may be formed in a region surrounded by the peripheral edge in the lower surface 11b. In this case, when the semiconductor device is completed and packaged, the adhesion between the lower surface 11b of the die pad 11 and a bonding material, such as solder, provided on the lower surface 11b of the die pad 11 increases.

Thereafter, the structure depicted in FIG. 14C is cut along scribe lines into the individual regions C, using, for example, a slicer. As a result, multiple semiconductor devices including the one depicted in FIG. 14D are completed.

Figure 14D:
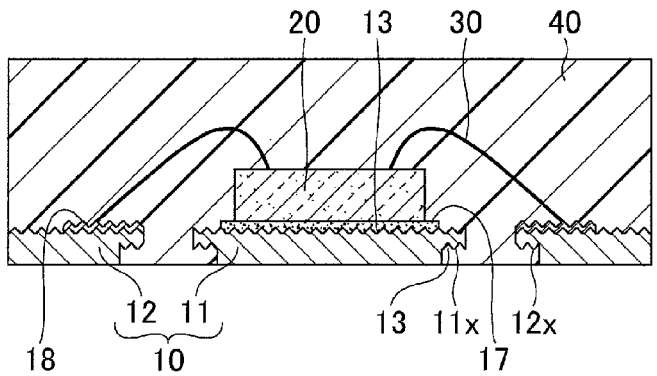

Referring to FIG. 14D, the semiconductor device includes an adhesive 17 used to mount (bond) the semiconductor chip 20 onto the die pad 11 and a plating film 18 provided on the wire bonding portions of the leads 12 to improve the bondability (wire bondability) of the metal wires 30.

Thus, according to the process of manufacturing the leadframe 10T, a predetermined pattern for forming the uneven surface part 13 is formed in etching masks used to etch the plate 10B to form the die pads 11, the leads 12, etc. As a result, by performing etching once, it is possible to form the die pads 11, the leads 12, etc., and reduce the thickness of the leadframe 10T where the predetermined pattern for the uneven surface part 13 is formed. That is, because it is possible to reduce the thickness of a predetermined part of the leadframe 10T in the same process as the die pads 11, the leads 12, etc., are formed, it is possible to streamline the manufacturing process and reduce the manufacturing cost.

Furthermore, it is possible to form the die pads 11, the leads 12, etc., and the uneven surface part 13 simultaneously using a single etching mask. Accordingly, in principle, there is no misalignment between the die pads 11, the leads 12, etc., and the uneven surface part 13. Accordingly, it is possible to form the uneven surface part 13 at desired positions on the die pads 11, the leads 12, etc.

According to a conventional technique that performs etching for surface roughening separately from the etching for forming the die pads 11, the leads 12, etc., the manufacturing process becomes complicated to increase cost, and the position accuracy of roughened regions deteriorates.

According to the second embodiment, in addition to the effects described in the first embodiment, the following effect is produced by forming the uneven surface part 13 in the upper surfaces 11a of the die pads 11, the upper surfaces 12a of the leads 12, and the upper surfaces 153a of the support bars 153. That is, when a semiconductor device is formed using the leadframe 10T, the surface area of parts of the die pads 11, the leads 12, and the support bars 153 contacting the resin 40 increases to produce the anchoring effect. Accordingly, it is possible to increase the adhesion between the leadframe 10T and the resin 40. Consequently, it is possible to prevent delamination of the leadframe 10T and the resin 40 at their interface.

Figure 22:
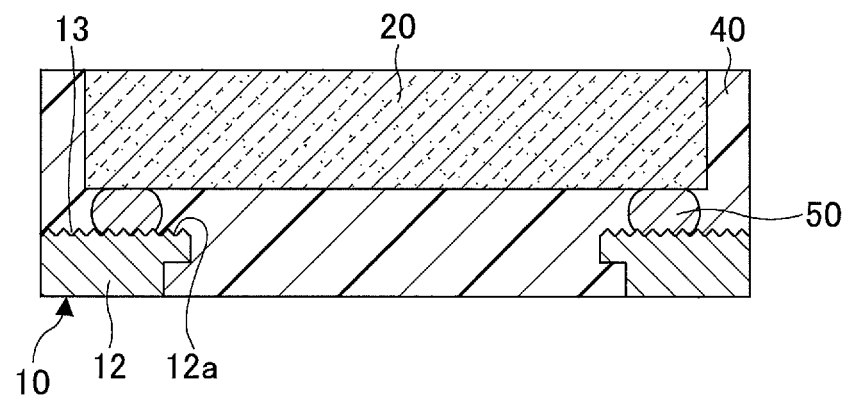
FIG. 22 is a cross-sectional view of another semiconductor device according to the second embodiment.

Another example of the semiconductor device according to the second embodiment is described below. FIG. 22 is a cross-sectional view of another semiconductor device. The semiconductor device depicted in FIG. 22 includes the leads 12 but has no die pad or support bars. The semiconductor chip 20 is connected face down (by flip chip bonding) onto the leadframe 10 so that the electrode terminals of the semiconductor chip 20 are connected to the upper surfaces 12a of the leads 12 via connection terminals 50 (connecting members) such as solder bumps, gold bumps or copper bumps. In this case, the rear surface (upper surface in FIG. 22) of the semiconductor chip 20 may be exposed at the upper surface of the resin 40 to reduce the thickness of the semiconductor device and to increase the heat dissipation of the semiconductor chip 20. The rear surface of the semiconductor chip 20, however, may be covered with the resin 40.

The leadframe 10 of the semiconductor device depicted in FIG. 22 may be formed by removing the die pad 11 and the support bars 153 from the leadframe 10T depicted in FIGS. 9A and 9B. Specifically, in the process depicted in FIGS. 11A through 11D, the resists 340 and 350 may be formed to expose a portion of the plate 10B to become the die pad 11 and the support bars 153. Then, etching may be performed with the resists 340 and 350 for forming only the leads 12 the same as in the process depicted in FIGS. 12A through 12D. Thereafter, the resists 340 and 350 are removed the same as in the process depicted in FIGS. 13A through 13D. Then, the semiconductor chip 20 is mounted face down on the upper surfaces 12a of the leads 12 through the connection terminals 50 by flip chip bonding. Then, the leadframe 10T, the semiconductor chip 20, and the connection terminals 50 are encapsulated in the resin 40 the same as in the process depicted in FIG. 14C to complete the semiconductor device that includes the leads 12 but has no die pad or support bars as depicted in FIG. 22. The plating film 18 may be provided on the upper surfaces 12a of the leads 12 where the connection terminals 50 are provided.

[First Variation of First Embodiment]

A first variation of the first embodiment illustrates a case of reducing the thickness of a dam bar. In the description of the first variation, a description of the same elements or configurations as those of the above-described embodiments may be omitted.

Figure 15A:
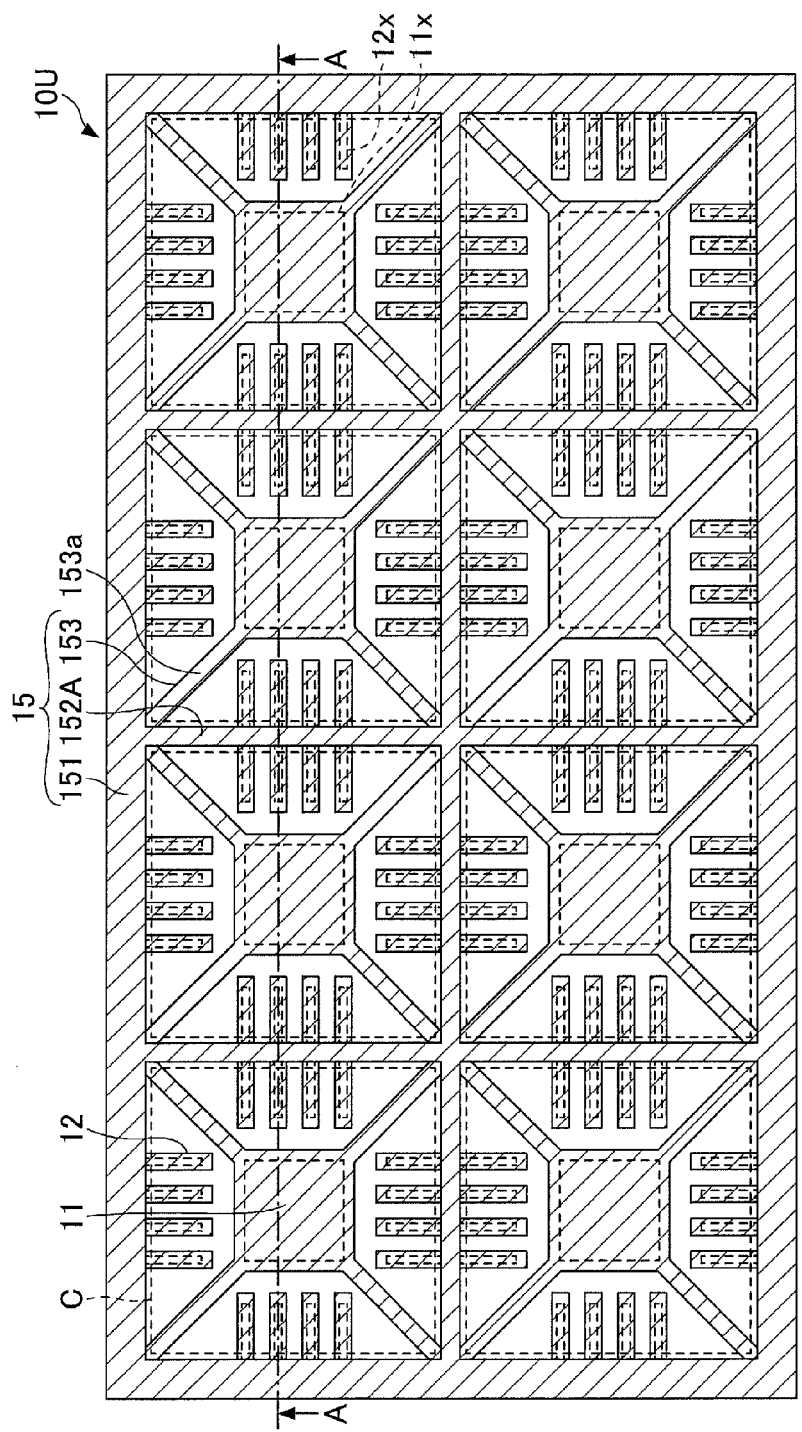
FIGS. 15A and 15B are diagrams depicting a leadframe according to a first variation of the first embodiment.
Figure 15B:
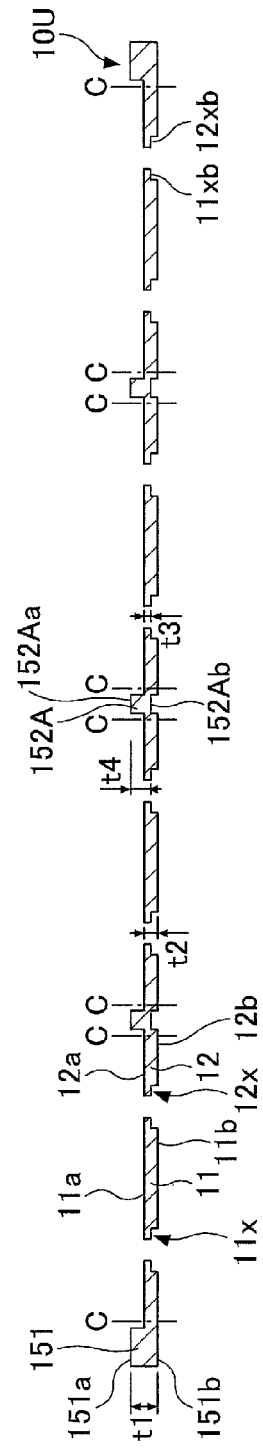

FIG. 15A is a plan view of a leadframe according to the first variation. FIG. 15B is a cross-sectional view of the leadframe taken along a line A-A in FIG. 15A. The plan view of FIG. 15A is provided with hatching lines corresponding to those in FIG. 15B to facilitate understanding of the drawings.

Referring to FIGS. 15A and 15B, a leadframe 10U is different from the leadframe 10S (see FIGS. 1A and 1B) in that the dam bar 152 is replaced with a dam bar 152A. The dam bar 152A is half-etched on its lower side to be thinner in its entirety than the dam bar 152.

According to the leadframe 10U, the upper surface 151a of the outer frame part 151 and an upper surface 152Aa of the dam bar 152A are in the same plane. The upper surfaces 11a of the die pads 11, the upper surfaces 12a of the leads 12, and the upper surfaces 153a of the support bars 153 are in the same plane. The lower surfaces 11xb of the step parts 11x, the lower surfaces 12xb of the step parts 12x, a lower surface 152Ab of the dam bar 152A, and the lower surfaces (not illustrated) of the support bars 153 are in the same plane. The lower surface 151b of the outer frame part 151, the lower surfaces 11b of the die pads 11 (except for the step parts 11x), and the lower surfaces 12b of the leads 12 (except for the step parts 12x) are in the same plane.

Furthermore, the interval (depth) from the upper surface 151a of the outer frame part 151 and the upper surface 152Aa of the dam bar 152A to the upper surfaces 11a of the die pads 11, the upper surfaces 12a of the leads 12, and the upper surfaces 153a of the support bars 153 is greater than the interval (depth) from the lower surfaces 11xb of the step parts 11x, the lower surfaces 12xb of the step parts 12x, the lower surface 152Ab of the dam bar 152A, and the lower surfaces (not depicted) of the support bars 153 to the lower surface 151b of the outer frame part 151, the lower surfaces 11b of the die pads 11 (except for the step parts 11x), and the lower surfaces 12b of the leads 12 (except for the step parts 12x). The thickness t3 of the step parts 11x, the step parts 12x, and the support bars 153 is smaller than the thickness t2 of the die pads 11 and the leads 12. Furthermore, a thickness t4 of the dam bar 152A is smaller than the thickness t1 of the outer frame part 151 and greater than the thickness t2 of the die pads 11 and the leads 12.

In order to reduce the thickness of the dam bar 152A, for example, in the process depicted in FIGS. 3A and 3B of the first embodiment, an opening to expose a lower surface of a portion of the plate 10B to become the dam bar 152A may be additionally formed in the resist 310, and the same process as depicted in FIGS. 4A and 4B may be performed. As a result, along with the die pads 11, the leads 12, etc., the dam bar 152A half-etched on its lower side can be formed.

According to the leadframe 10U, while the dam bar 152A is reduced in thickness, the outer frame part 151 is not reduced in thickness. Therefore, the stiffness of the entire leadframe 10U is maintained. By reducing the thickness of the dam bar 152A on its lower side, it is possible to reduce a stress caused by cutting the leadframe 10U along scribe lines into the individual regions C using a slicer. Furthermore, it is possible to reduce the possibility of formation of burrs on cut parts of the leadframe 10U and to give a slicer blade a longer service life.

It is also possible to modify the second embodiment in the same manner as in the first variation. In this case, for example, in the process depicted in FIGS. 11A through 11D of the second embodiment, an opening to expose a lower surface of a portion of the plate 10B to become the dam bar 152A may be additionally famed in the resist 350, and the same process as depicted in FIGS. 12A through 12D may be performed. As a result, along with the die pads 11, the leads 12, etc., the dam bar 152A half-etched on its lower side can be formed.

Alternatively, in the process depicted in FIGS. 11A through 11D of the second embodiment, the same openings as the openings 350y may be additionally formed in part of the resist 350 corresponding to the dam bar 152A, and the same process as depicted in FIGS. 12A through 12D may be performed. As a result, along with the die pads 11, the leads 12, etc., the dam bar 152A half-etched on its lower side can be formed. In this case, the uneven surface part 13 is famed in the lower surface 152Ab of the dam bar 152A.

According to this method, it is possible to change the amount of etching by controlling one or more of the planar shape, the size, and the pitch of resist openings for forming the uneven surface part 13. Therefore, it is possible to provide the dam bar 152A with a desired thickness different from the thickness of other thinned parts.

[Second Variation of First Embodiment]

A second variation of the first embodiment illustrates another case of reducing the thickness of a dam bar. In the description of the second variation, a description of the same elements or configurations as those of the above-described embodiments may be omitted.

Figure 16A:
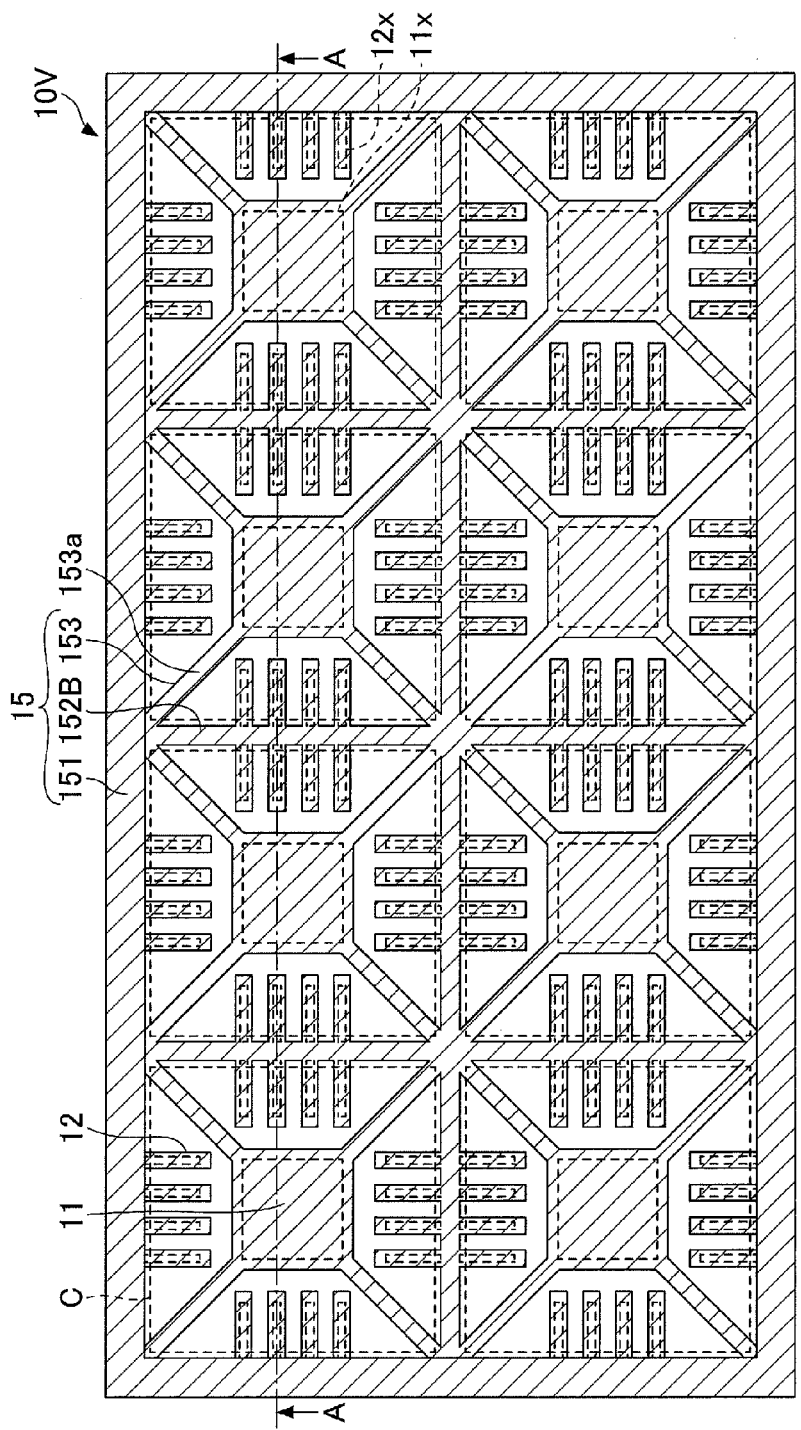
FIGS. 16A and 16B are diagrams depicting a leadframe according to a second variation of the first embodiment.
Figure 16B:
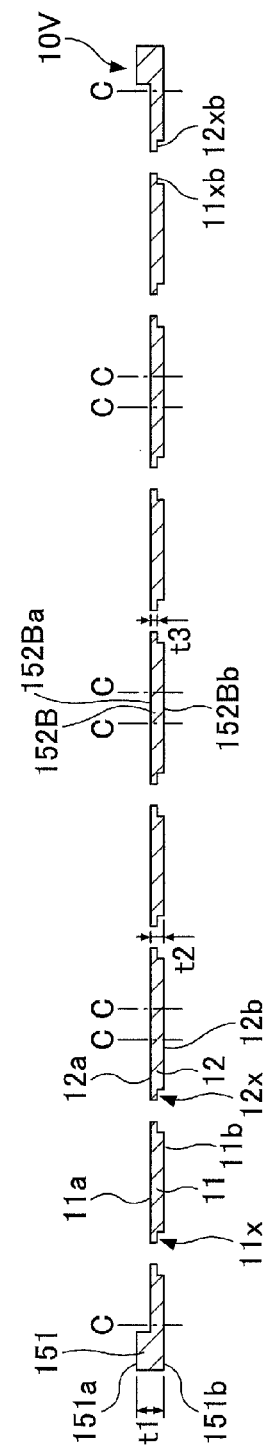

FIG. 16A is a plan view of a leadframe according to the second variation. FIG. 16B is a cross-sectional view of the leadframe taken along a line A-A in FIG. 16A. The plan view of FIG. 16A is provided with hatching lines corresponding to those in FIG. 16B to facilitate understanding of the drawings.

Referring to FIGS. 16A and 16B, a leadframe 10V is different from the leadframe 10S (see FIGS. 1A and 1B) in that the dam bar 152 is replaced with a dam bar 152B. The dam bar 152B is half-etched on its upper side to be thinner in its entirety than the dam bar 152.

According to the leadframe 10V, the upper surfaces 11a of the die pads 11, the upper surfaces 12a of the leads 12, an upper surface 152Ba of the dam bar 152B, and the upper surfaces 153a of the support bars 153 are in the same plane. The lower surfaces 11xb of the step parts 11x, the lower surfaces 12xb of the step parts 12x, and the lower surfaces (not illustrated) of the support bars 153 are in the same plane. The lower surface 151b of the outer frame part 151, a lower surface 152Bb of the dam bar 152B, the lower surfaces 11b of the die pads 11 (except for the step parts 11x), and the lower surfaces 12b of the leads 12 (except for the step parts 12x) are in the same plane.

Furthermore, the interval (depth) from the upper surface 151a of the outer frame part 151 to the upper surfaces 11a of the die pads 11, the upper surfaces 12a of the leads 12, the upper surface 152Ba of the dam bar 152B, and the upper surfaces 153a of the support bars 153 is greater than the interval (depth) from the lower surfaces 11xb of the step parts 11x, the lower surfaces 12xb of the step parts 12x, and the lower surfaces (not depicted) of the support bars 153 to the lower surface 151b of the outer frame part 151, the lower surface 152Bb of the dam bar 152B, the lower surfaces 11b of the die pads 11 (except for the step parts 11x), and the lower surfaces 12b of the leads 12 (except for the step parts 12x). The thickness t3 of the step parts 11x, the step parts 12x, and the support bars 153 is smaller than the thickness t2 of the die pads 11 and the leads 12. Furthermore, a thickness of the dam bar 152B is smaller than the thickness t1 of the outer frame part 151 and equal to the thickness t2 of the die pads 11 and the leads 12.

In order to reduce the thickness of the dam bar 152B, for example, in the process depicted in FIGS. 6A and 6B of the first embodiment, the openings 320x may be formed in the resist 320 to expose an upper surface of a portion of the plate 10B to become the dam bar 152B, and the same process as depicted in FIGS. 7A and 7B may be performed. As a result, the dam bar 152B can be reduced in thickness as the die pads 11 and the leads 12.

According to the leadframe 10V, while the dam bar 152B is reduced in thickness, the outer frame part 151 is not reduced in thickness. Therefore, the stiffness of the entire leadframe 10V is maintained. By reducing the thickness of the dam bar 152B on its upper side, it is possible to reduce a stress caused by cutting the leadframe 10V along scribe lines into the individual regions C using a slicer. Furthermore, it is possible to reduce the possibility of formation of burrs on cut parts of the leadframe 10V and to give a slicer blade a longer service life.

It is also possible to modify the second embodiment in the same manner as in the second variation. In this case, for example, in the process depicted in FIGS. 11A through 11D of the second embodiment, an opening to expose an upper surface of a portion of the plate 10B to become the dam bar 152B may be additionally formed in the resist 340, and the same process as depicted in FIGS. 12A through 12D may be performed. As a result, along with the die pads 11, the leads 12, etc., the dam bar 152B half-etched on its upper side can be formed.

Alternatively, in the process depicted in FIGS. 11A through 11D of the second embodiment, the same openings as the openings 340y may be additionally formed in part of the resist 340 corresponding to the dam bar 152B, and the same process as depicted in FIGS. 12A through 12D may be performed. As a result, along with the die pads 11, the leads 12, etc., the dam bar 152B half-etched on its upper side can be formed. In this case, the uneven surface part 13 is formed in the upper surface 152Ba of the dam bar 152B.

According to this method, it is possible to change the amount of etching by controlling one or more of the planar shape, the size, and the pitch of resist openings for forming the uneven surface part 13. Therefore, it is possible to provide the dam bar 152B with a desired thickness different from the thickness of other thinned parts.

[Third Variation of First Embodiment]

A third variation of the first embodiment illustrates another manufacturing method for obtaining the leadframe 10S of the first embodiment. In the description of the third variation, a description of the same elements or configurations as those of the above-described embodiments may be omitted.

Figure 17A:
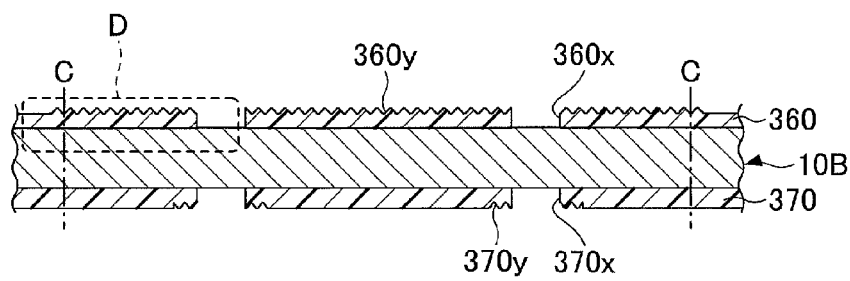
FIGS. 17A through 17D are diagrams depicting a leadframe according to a third variation of the first embodiment.
Figure 17B:
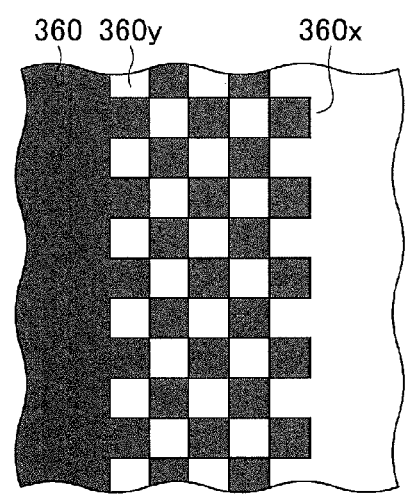
Figure 17C:
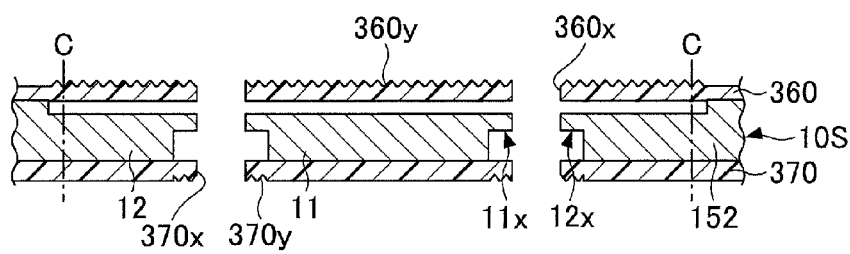
Figure 17D:
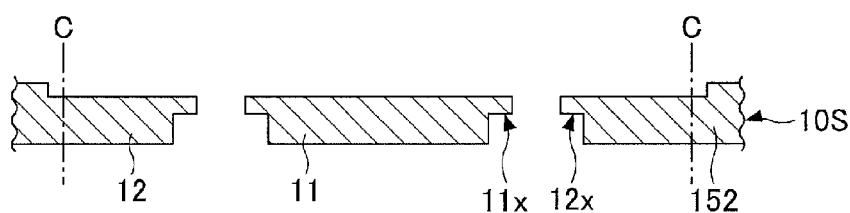

FIGS. 17A through 17D are diagrams depicting a process of manufacturing a leadframe according to the third variation. FIGS. 17A, 17C and 17D depict cross sections corresponding to the cross section depicted in FIG. 3B. FIG. 17B is an enlarged plan view of part indicated by D in FIG. 17A.

First, in the process depicted in FIG. 17A, the metal plate 10B having a predetermined shape is prepared the same as in the process depicted in FIGS. 2A and 2B, and a photoresist 360 ("resist 360") and a photoresist 370 ("resist 370") are formed on the upper surface and the lower surface, respectively, of the plate 10B. Then, the resists 360 and 370 are exposed to light and developed to form openings 360x and 360y and openings 370x and 370y at predetermined positions in the resists 360 and 370, respectively.

The openings 360x and 370x are openings for forming the die pads 11, the leads 12, and the connecting part 15 in the plate 10B, that is, openings for piercing through the plate 10B by etching. Furthermore, the openings 360y and 370y are openings for controlling the depth of half-etching, and may be provided to form a checkered resist pattern as depicted in FIG. 17B, for example. The openings 360y are formed on upper surfaces of portions of the plate 10B to become the die pads 11, the leads 12, and the support bars 153. The openings 370y are formed on lower surfaces of portions of the plate 10B to become the step parts 11x and 12x and the support bars 153.

Next, in the process depicted in FIG. 17C, the resists 360 and 370 are used to perform etching (such as wet etching) on the plate 10B. Then, in the process depicted in FIG. 17D, the resists 360 and 370 depicted in FIG. 17C are removed. As a result, the leadframe 10S is completed.

As a result of etching, the plate 10B is pierced through where the openings 360x and 370x are formed one over the other in a plan view, is half-etched only on its upper side to be reduced in thickness where the openings 360y are formed, and is half-etched only on its lower side to be reduced in thickness where the openings 370y are formed. As a result, at the same time that the die pads 11, the leads 12, and the support bars 153 are formed where the plate 10B is reduced in thickness on its upper side, the step parts 11x and 12x and the support bars 153 are formed where the plate 10B is reduced in thickness on its lower side.

By modifying one or more of the shape, the pitch, etc., of the openings 360y and 370y in the resist pattern depicted in FIG. 17B, the upper surfaces 11a of the die pads 11, the upper surfaces 12a of the leads 12, the upper surfaces 153a of the support bars 153, the lower surfaces 11xb and 12xb of the step parts 11x and 12x, and the lower surfaces (not depicted) of the support bars 153 can be formed flat by half-etching.

Thus, according to the manufacturing process depicted in FIGS. 17A through 17D, the resist pattern depicted in FIG. 17B may be modified to form the leadframe 10S by performing etching once. This makes it possible to streamline the manufacturing process and reduce the manufacturing cost.

EXAMPLE 1

Figure 18A:
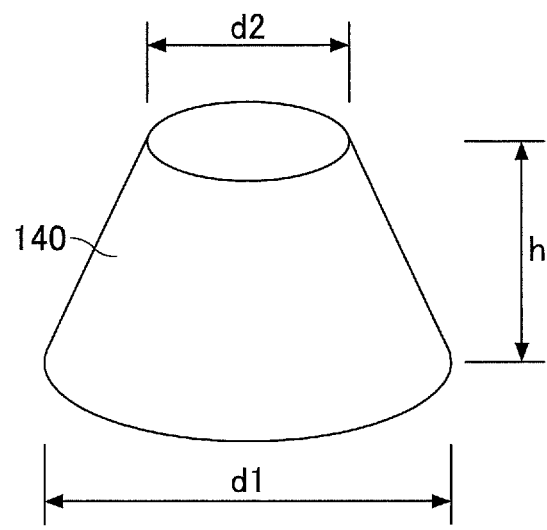
FIGS. 18A and 18B are diagrams depicting a test sample for a cup shear test.
Figure 18B:
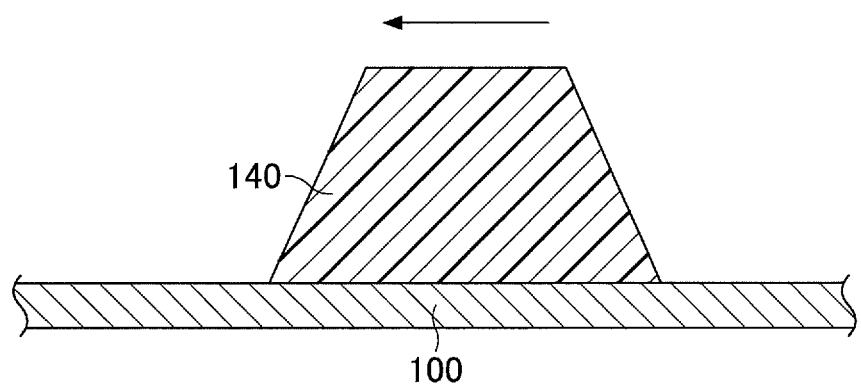

First, test samples as depicted in FIGS. 18A and 18B were made. Specifically, an uneven surface part including depressions each having a planar shape of a circle more than or equal to 0.020 mm and less than or equal to 0.060 mm in diameter was foamed in an upper surface of a leadframe material 100 that is a flat metal plate formed of copper. A resin cup 140 was then formed on the uneven surface part under the conditions of formation indicated in TABLE 1 below without plating a surface of the uneven surface part. With respect to each of six S ratios, six test samples were made, and a measurement was conducted six times. An S ratio of 1 indicates test samples without an uneven surface part (conventional products serving as a comparative example). In determining an S ratio, a surface area was measured using a laser confocal microscope (LEXT OLS4100, a product of OLYMPUS CORPORATION).

TABLE 1

| RESIN TYPE | EPOXY RESIN |
|---|---|
| HEIGHT h | 3 mm |
| BOTTOM DIAMETER d1 | 3.568 mm |
| TOP DIAMETER d2 | 3 mm |
| SURFACE AREA | 10.2 mm$^2$ |
| THERMAL HISTORY | 175° C. × 1 h (N$_2$) + 230° C. × 10 min. (AIR) |
| RESIN CURING CONDITION | 175° C. × 6 h (AIR) |

As indicated in TABLE 1, the test samples were heated at 175° C. for 1 hour in a nitrogen atmosphere, and were thereafter heated at 230° C. for 10 minutes in the air as a thermal history. The thermal history assumes heating in a semiconductor chip mounting process (die attach process) and a wire bonding process performed before encapsulating a semiconductor chip, etc., in resin during a manufacturing process from the manufacture of a leadframe to the manufacture of a semiconductor device.

That is, the leadframe is oxidized to no small extent by heating in these processes to affect the adhesive force between resin and the leadframe. Therefore, in this test as well, the resin cup 140 was formed after adding a thermal history corresponding to heating in the actual die attach process and wiring bonding process to the leadframe materials 100 of the test samples. As a result, it is possible to obtain highly reliable test results.

Next, a cup shear test was conducted following the procedure provided by the SEMI G69-0996 standard. Specifically, a gauge (not depicted) was pressed against the resin cup 140 of each test sample to be moved in the direction of an arrow in FIG. 18B to measure the shear strength. The test was conducted at room temperature (approximately 25° C.). The height of the gauge was 20 μm and the speed of the gauge was 200 μm/s.

Figure 19:
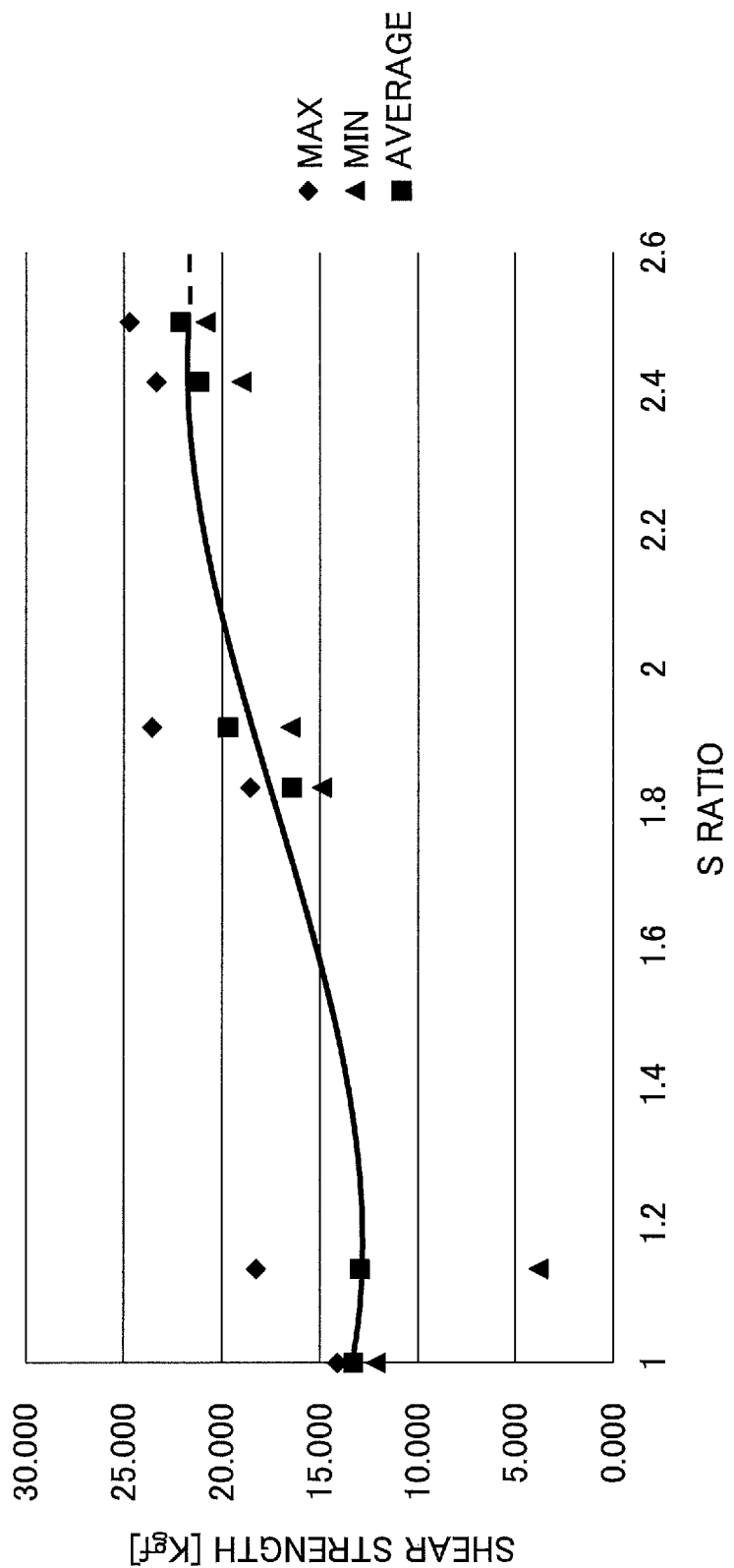
FIG. 19 is a graph indicating the results of a cup shear test according to Example 1.

FIG. 19 indicates the test results. Referring to FIG. 19, while the shear strength of the test samples (S ratio=1) of the comparative example is approximately 13 [Kgf] on average, the shear strength of the test samples having an S ratio of 1.8 or more is 17 [Kgf] or more on average. That is, it has been found that the adhesion between the leadframe and resin significantly increases compared with the conventional products when the S ratio is 1.8 or more. When the S ratio is approximately 2.5, an increase in the shear strength saturates. This is because part of the resin comes off (breaks) before delamination of the leadframe and the resin at their interface.

EXAMPLE 2

The same uneven surface part as in Example 1 was famed in the upper surface of the copper leadframe material 100, and a cup shear test was conducted in the same manner as in Example 1 except that the surface of the uneven surface part was plated with silver and the resin cup 140 was famed on the silver-plated uneven surface part. The thickness of the silver plating film was approximately 6 µm.

Figure 20:
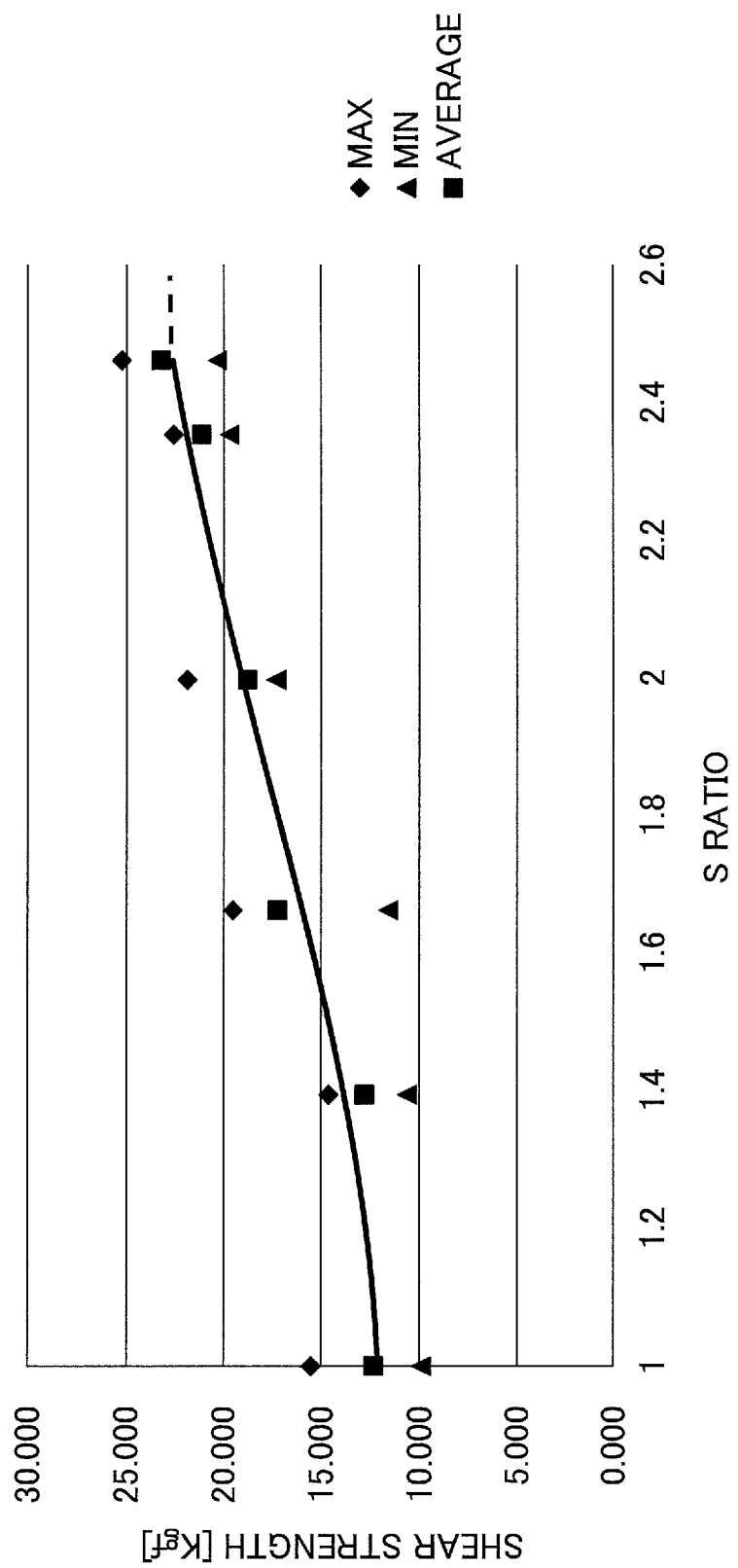
FIG. 20 is a graph indicating the results of a cup shear test according to Example 2.

FIG. 20 indicates the test results. Referring to FIG. 20, while the shear strength of the test samples (S ratio=1) of the comparative example is approximately 13 [Kgf] on average, the shear strength of the test samples having an S ratio of 1.7 or more is 17 [Kgf] or more on average. That is, it has been found that the adhesion between the sliver plating film famed on the leadframe and resin significantly increases compared with the conventional products when the S ratio is 1.7 or more.

EXAMPLE 3

The same uneven surface part as in Example 1 was famed in the upper surface of the copper leadframe material 100, and a cup shear test was conducted in the same manner as in Example 1 except that the surface of the uneven surface part was plated with Ni/Pd/Au and the resin cup 140 was formed on the Ni/Pd/Au-plated uneven surface part.

The Ni/Pd/Au plating is a laminate of a Ni plating film, a Pd plating film, and a Au plating film stacked on the upper surface of the leadframe material 100 in this order. According to Example 3, the thickness of the Ni plating film was approximately 0.8 µm, the thickness of the Pd plating film was approximately 0.03 µm, and the thickness of the Au plating film was approximately, 0.006 µm.

Figure 21:
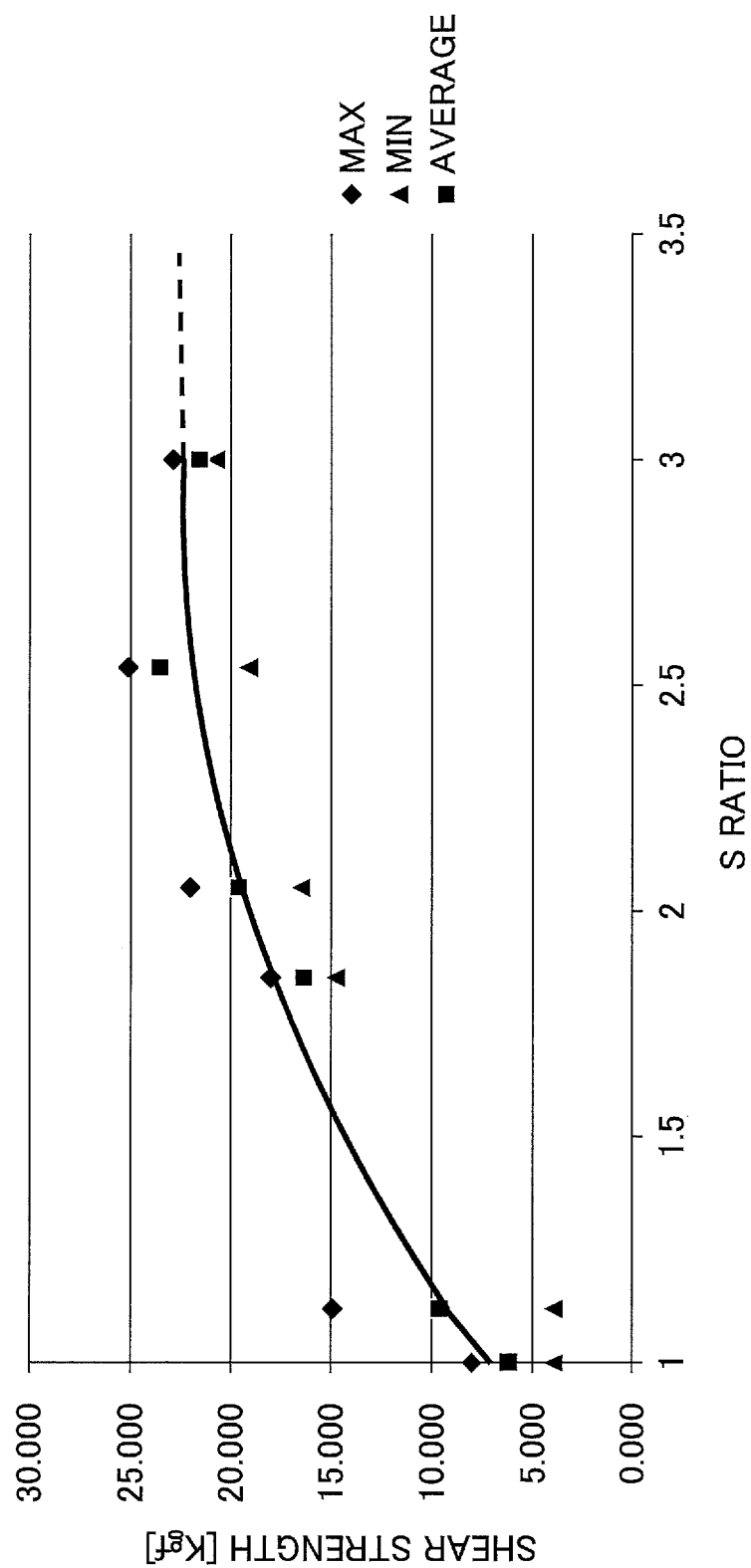
FIG. 21 is a graph indicating the results of a cup shear test according to Example 3.

FIG. 21 indicates the test results. Referring to FIG. 21, while the shear strength of the test samples (S ratio=1) of the comparative example is approximately 6 [Kgf] on average, the shear strength of the test samples having an S ratio of 1.8 or more is 17 [Kgf] or more on average. That is, it has been found that the adhesion between the Ni/Pd/Au plating film formed on the leadframe and resin significantly increases compared with the conventional products when the S ratio is 1.8 or more.

SUMMARY OF EXAMPLES

By forming an uneven surface part that includes depressions having a planar shape of a circle more than or equal to 0.020 mm and less than or equal to 0.060 mm in diameter to have an S ratio of 1.7 or more in an upper surface of a copper leadframe, the surface area of a part of the leadframe that contacts resin increases. Therefore, the anchoring effect is produced to make it possible to increase the adhesion between the leadframe and resin.

Furthermore, the uneven surface part can maintain the S ratio at a certain level or higher even after being plated with silver or Ni/Pd/Au. Therefore, even in the case of providing resin on the plated surface of the leadframe, it is possible to increase the adhesion between the leadframe and resin.

A range of S ratios suitable for practical use is from approximately 1.7 to approximately 2.5. In view of the adhesion increasing effect and the saturation of an increase in adhesion, a more suitable range of S ratios is from approximately 1.8 to approximately 2.0.

The same effect has been confirmed with the case where the planar shape of depressions in the uneven surface part is a polygon whose circumcircle has a diameter of greater than or equal to 0.020 mm and smaller than or equal to 0.060 mm.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, according to the above-described embodiments, multiple individual regions are arranged in a matrix in a leadframe. Alternatively, the individual regions may be arranged in a row. In this case, the dam bar may be in the form of one or more bars each positioned between adjacent individual regions. As yet another alternative, the leadframe may be formed of a single individual region and an outer frame part that supports the single individual region through its peripheral edge.

Furthermore, while the embodiments and variations above are described using a QFN-type leadframe as an example, the present invention may also be applied to other types of leadframes such as leadframes of a quad flat package (QFP) type and leadframes of a lead on chip (LOC) type.

Furthermore, while a QFN-type leadframe is illustrated as having die pads by way of example in the above-described embodiments and variations, the present invention may also be applied to QFN-type leadframes without die pads.

Furthermore, according to the first embodiment and its variations as well, it is possible to mount a semiconductor chip on a leadframe to manufacture a semiconductor device in the same manner as in the second embodiment.

Various aspects of the subject-matter described herein may be set out non-exhaustively in the following numbered clauses:

1. A method of manufacturing a leadframe, including:
forming, in a metal plate, an individual region to become a semiconductor device, and an outer frame part supporting the individual region through a peripheral edge thereof;
forming a first resist and a second resist, the first resist exposing a first surface of the individual region and covering a first surface of the outer frame part, the second resist covering a second surface of the individual region opposite to the first surface thereof and covering a second surface of the outer frame part opposite to the first surface thereof; and
etching the metal plate using the first resist and the second resist as etching masks to make the individual region thinner than the outer frame part.

2. A method of manufacturing a leadframe, including:
forming a first resist and a second resist on a metal plate that includes a first part to become an individual region to form a semiconductor device and a second part to become an outer frame part to support the individual region through a peripheral edge thereof, the first resist covering a first surface of the first part and a first surface of the second part, the second resist covering a second surface of the first part opposite to the first surface thereof and a second surface of the second part opposite to the first surface thereof; and
etching the metal plate using the first resist and the second resist as etching masks to form the individual region and the outer frame part so that the individual region is thinner than the outer frame part,
wherein forming the first resist and the second resist includes forming a plurality of openings in a region of the first resist covering the first surface of the first part so that the plurality of openings are arranged vertically and laterally in a plan view.

3. The method of clause 2, wherein
etching includes forming an uneven surface part including depressions in a surface of the individual region,
a planar shape of each of the depressions is a circle whose diameter is greater than or equal to 0.020 mm and smaller than or equal to 0.060 mm or a polygon whose circumcircle has a diameter of greater than or equal to 0.020 mm and smaller than or equal to 0.060 mm, and
a ratio of a surface area of the uneven surface part to a surface area of a planar surface in a case of forming the uneven surface part in the planar surface is 1.7 or more.

4. A method of manufacturing a leadframe, including:
forming a first resist and a second resist on a metal plate that includes a first part to become a plurality of individual regions to form semiconductor devices and a second part to become an outer frame part having a frame shape to surround and support the plurality of individual regions, the first resist covering a first surface of the first part and a first surface of the second part, the second resist covering a second surface of the first part opposite to the first surface thereof and a second surface of the second part opposite to the first surface thereof; and
etching the metal plate using the first resist and the second resist as etching masks to form the plurality of individual regions, the outer frame part, a dam bar connected to the outer frame part to be positioned between the plurality of individual regions within the outer frame part, and a plurality of support bars each provided in one of the plurality of individual regions to be connected to at least one of the outer frame part and the dam bar, so that the plurality of individual regions are thinner than the outer frame part, and the plurality of support bars are thinner than the outer frame part,
wherein forming the first resist and the second resist includes forming a plurality of openings in a region of the first resist covering the first surface of the first part so that the plurality of openings are arranged vertically and laterally in a plan view.

5. The method of clause 4, wherein etching etches the metal plate so that the dam bar is thinner than the outer frame part.

What is claimed is:

1. A leadframe, comprising:
an individual region to become a semiconductor device, the individual region including a lead, the lead including a first surface and a second surface that are opposite to each other in a thickness direction of the leadframe; and
an outer frame part supporting the individual region through a peripheral edge thereof, the outer frame part including a first surface and a second surface that are opposite to each other in the thickness direction,
wherein a thickness of the outer frame part is greater than a thickness of an entirety of the individual region,
the lead extends from the outer frame part, and a peripheral edge of the second surface of the lead is stepped toward the first surface of the lead to form a step part along three sides of the second surface of the lead,
the second surface of the outer frame part and the second surface of the lead except for the step part are in a first plane, and
the first surface of the lead and the second surface of the step part of the lead are positioned between the first plane and a second plane in which the first surface of the outer frame part is positioned.

2. The leadframe as claimed in claim 1, wherein
the individual region includes a covered region to be covered with an encapsulation resin,
an uneven surface part including depressions is formed in the covered region,
a planar shape of each of the depressions is a circle whose diameter is greater than or equal to 0.020 mm and smaller than or equal to 0.060 mm or a polygon whose circumcircle has a diameter of greater than or equal to 0.020 mm and smaller than or equal to 0.060 mm, and
a ratio of a surface area of the uneven surface part to a surface area of a planar surface in a case of forming the uneven surface part in the planar surface is 1.7 or more.

3. The leadframe as claimed in claim 2, wherein
the covered region includes a connection region to be connected to a semiconductor chip, and
the uneven surface part is formed in the connection region.

4. The leadframe as claimed in claim 2, wherein:
a surface of the uneven surface part is plated, and
the surface area of the uneven surface part is an area of the plated surface of the uneven surface part.

5. A leadframe, comprising:
a plurality of individual regions to become semiconductor devices, the plurality of individual regions each including a lead, the lead including a first surface and a second surface that are opposite to each other in a thickness direction of the leadframe;
an outer frame part having a frame shape to surround and support the plurality of individual regions, the outer frame part including a first surface and a second surface that are opposite to each other in the thickness direction; and
a dam bar connected to the outer frame part to be positioned between the plurality of individual regions within the outer frame part,
wherein a thickness of the outer frame part is greater than a thickness of an entirety of each of the plurality of individual regions,
the lead extends from the outer frame part or the dam bar, and a peripheral edge of the second surface of the lead is stepped toward the first surface of the lead to form a step part along three sides of the second surface of the lead,
the second surface of the outer frame part and the second surface of the lead except for the step part are in a first plane, and
the first surface of the lead and the second surface of the step part of the lead are positioned between the first plane and a second plane in which the first surface of the outer frame part is positioned.

6. The leadframe as claimed in claim 5, wherein the thickness of the outer frame part is greater than a thickness of the dam bar.

7. The leadframe as claimed in claim 5, wherein
each of the plurality of individual regions includes a covered region to be covered with an encapsulation resin,
an uneven surface part including depressions is fowled in the covered region of each of the plurality of individual regions,
a planar shape of each of the depressions is a circle whose diameter is greater than or equal to 0.020 mm and smaller than or equal to 0.060 mm or a polygon whose circumcircle has a diameter of greater than or equal to 0.020 mm and smaller than or equal to 0.060 mm, and a ratio of a surface area of the uneven surface part to a surface area of a planar surface in a case of forming the uneven surface part in the planar surface is 1.7 or more.

8. The leadframe as claimed in claim 7, wherein
the covered region of each of the plurality of individual regions includes a connection region to be connected to a semiconductor chip, and
the uneven surface part is formed in the connection region.

9. The leadframe as claimed in claim 7, wherein:
a surface of the uneven surface part is plated, and
the surface area of the uneven surface part is an area of the plated surface of the uneven surface part.

10. The leadframe as claimed in claim 5, further comprising:
a plurality of support bars each provided in one of the plurality of individual regions to be connected to at least one of the outer frame part and the dam bar,
wherein the thickness of the outer frame part is greater than a thickness of the plurality of support bars.

11. The leadframe as claimed in claim 5, wherein the thickness of the outer frame part is equal to a thickness of the dam bar.

12. A semiconductor device, comprising:
a leadframe including a lead;
a semiconductor chip mounted on the leadframe; and
an encapsulation resin encapsulating the leadframe and the semiconductor chip,
wherein an uneven surface part including depressions is provided in a surface of the lead,
wherein a planar shape of each of the depressions is a circle whose diameter is greater than or equal to 0.020 mm and smaller than or equal to 0.060 mm or a polygon whose circumcircle has a diameter of greater than or equal to 0.020 mm and smaller than or equal to 0.060 mm, and
wherein a ratio of a surface area of the uneven surface part to a surface area of a planar surface in a case of forming the uneven surface part in the planar surface is 1.7 or more.

13. The semiconductor device as claimed in claim 12, further comprising:
a connecting member electrically connecting the semiconductor chip and the surface of the lead, and encapsulated in the encapsulation resin.

14. The semiconductor device as claimed in claim 13, wherein the connecting member is a metal wire or a metal bump.

15. The semiconductor device as claimed in claim 12, further comprising:
a metal wire connecting the semiconductor chip and the surface of the lead, and encapsulated in the encapsulation resin,
wherein the leadframe further includes a die pad, and the semiconductor chip is mounted on a surface of the die pad.

16. The semiconductor device as claimed in claim 15, wherein the uneven surface part is further provided in the surface of the die pad.

17. The leadframe as claimed in claim 1, wherein
the individual region further includes
a die pad on which a semiconductor chip is to be mounted, the die pad including a first surface and a second surface that are opposite to each other in the thickness direction; and
a support bar connected to the outer frame part, the support bar including a first surface and a second surface that are opposite to each other in the thickness direction,
the second surface of the die pad is in the first plane, and
the first surface of the die pad and the first surface and the second surface of the support bar are positioned between the first plane and the second plane.

18. The leadframe as claimed in claim 5, wherein
each of the plurality of individual regions further includes
a die pad on which a semiconductor chip is to be mounted, the die pad including a first surface and a second surface that are opposite to each other in the thickness direction; and
a support bar connected to at least one of the outer frame part and the dam bar, the support bar including a first surface and a second surface that are opposite to each other in the thickness direction,
the second surface of the die pad is in the first plane, and
the first surface of the die pad and the first surface and the second surface of the support bar are positioned between the first plane and the second plane.

19. The leadframe as claimed in claim 5, wherein
the dam bar includes a first surface and a second surface that are opposite to each other in the thickness direction,
the second surface of the dam bar is in the first plane, and
the first surface of the dam bar is positioned between the first plane and the second plane.

20. The leadframe as claimed in claim 5, wherein
the dam bar includes a first surface and a second surface that are opposite to each other in the thickness direction,
the first surface of the dam bar is in the second plane, and
the second surface of the dam bar is positioned between the first plane and the second plane.

* * * * *